United States Patent
Schricker et al.

(10) Patent No.: US 8,878,235 B2
(45) Date of Patent: Nov. 4, 2014

(54) MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME

(75) Inventors: April D. Schricker, Palo Alto, CA (US); Wu-Yi Chien, San Jose, CA (US); Kun Hou, Milpitas, CA (US); Raghuveer S. Makala, Sunnyvale, CA (US); Jingyan Zhang, Santa Clara, CA (US); Yibo Nian, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 267 days.

(21) Appl. No.: 13/235,409

(22) Filed: Sep. 18, 2011

(65) Prior Publication Data
US 2012/0001150 A1 Jan. 5, 2012

Related U.S. Application Data

(63) Continuation-in-part of application No. 11/968,154, filed on Dec. 31, 2007, now Pat. No. 8,236,623.

(51) Int. Cl.
*H01L 27/08* (2006.01)
*H01L 29/96* (2006.01)
(Continued)

(52) U.S. Cl.
CPC ............... *B82Y 10/00* (2013.01); *G11C 13/025* (2013.01); *G11C 2213/79* (2013.01); *H01L 45/149* (2013.01); *H01L 27/101* (2013.01); *H01L 45/1233* (2013.01); *H01L 45/04* (2013.01); *H01L 27/2409* (2013.01); *G11C 13/0014* (2013.01); *G11C 5/02* (2013.01); *G11C 2213/72* (2013.01); *H01L 27/2481* (2013.01); *H01L 45/1616* (2013.01); *G11C 11/54* (2013.01); *G11C 2213/71* (2013.01); *B82Y 20/00* (2013.01); *G11C 2213/35* (2013.01); *H01L 27/2436* (2013.01)
USPC .......................... 257/107; 438/139; 365/105

(58) Field of Classification Search
USPC ........... 257/107, E27.004, E27.009, E27.035, 257/E29.022, E51.04; 365/69, 71, 100, 365/103, 105; 438/138, 139, 381, 382; 977/707, 708, 712, 720, 721, 742, 749, 977/69, 71, 100, 103, 105
See application file for complete search history.

(56) References Cited

U.S. PATENT DOCUMENTS

| 5,854,102 A | 12/1998 | Gonzalez et al. |
| 5,915,167 A | 6/1999 | Leedy |

(Continued)

FOREIGN PATENT DOCUMENTS

| CN | 1759450 | 4/2006 |
| EP | 1 796 103 | 6/2007 |

(Continued)

OTHER PUBLICATIONS

International Search Report and Written Opinion in counterpart International Application No. PCT/US2012/054571 mailed Jan. 23, 2013.

(Continued)

*Primary Examiner* — Daniel Shook
(74) *Attorney, Agent, or Firm* — Dugan & Dugan, PC

(57) ABSTRACT

In some aspects, a method of fabricating a memory cell is provided that includes fabricating a steering element above a substrate, and fabricating a reversible-resistance switching element coupled to the steering element by selectively fabricating carbon nano-tube ("CNT") material above the substrate, wherein the CNT material comprises a single CNT. Numerous other aspects are provided.

29 Claims, 22 Drawing Sheets

(51) Int. Cl.
*H01L 21/332* (2006.01)
*B82Y 10/00* (2011.01)
*H01L 45/00* (2006.01)
*H01L 27/10* (2006.01)
*H01L 27/24* (2006.01)
*G11C 13/00* (2006.01)
*G11C 5/02* (2006.01)
*G11C 11/54* (2006.01)
*B82Y 20/00* (2011.01)
*G11C 13/02* (2006.01)

(56) References Cited

U.S. PATENT DOCUMENTS

| | | | |
|---|---|---|---|
| 6,034,882 | A | 3/2000 | Johnson et al. |
| 6,706,402 | B2 | 3/2004 | Rueckes et al. |
| 6,858,481 | B2 | 2/2005 | Krieger et al. |
| 6,946,719 | B2 | 9/2005 | Petti et al. |
| 6,952,030 | B2 | 10/2005 | Herner |
| 7,149,108 | B2 | 12/2006 | Rinerson et al. |
| 7,176,064 | B2 | 2/2007 | Herner |
| 7,208,372 | B2 | 4/2007 | Hsu et al. |
| 7,286,388 | B1 | 10/2007 | Chen et al. |
| 7,385,234 | B2 | 6/2008 | Gopalakrishnan |
| 7,385,266 | B2 | 6/2008 | Segal et al. |
| 7,405,465 | B2 | 7/2008 | Herner |
| 7,575,984 | B2 | 8/2009 | Radigan |
| 7,638,383 | B2 | 12/2009 | Jin et al. |
| 2004/0160812 | A1 | 8/2004 | Rinerson et al. |
| 2004/0166235 | A1 | 8/2004 | Fujii et al. |
| 2005/0064167 | A1 | 3/2005 | Mao et al. |
| 2005/0195632 | A1 | 9/2005 | Rinerson et al. |
| 2006/0214183 | A1 | 9/2006 | Gaun et al. |
| 2006/0250836 | A1 | 11/2006 | Herner |
| 2006/0268594 | A1 | 11/2006 | Toda |
| 2006/0273298 | A1 | 12/2006 | Petti |
| 2006/0276056 | A1 | 12/2006 | Ward et al. |
| 2007/0018228 | A1 | 1/2007 | Sandhu et al. |
| 2007/0037414 | A1 | 2/2007 | Yamauchi et al. |
| 2007/0045691 | A1 | 3/2007 | Chang et al. |
| 2007/0103963 | A1 | 5/2007 | Kim et al. |
| 2007/0132049 | A1 | 6/2007 | Stipe |
| 2007/0133266 | A1 | 6/2007 | Furukawa et al. |
| 2007/0158697 | A1 | 7/2007 | Choi et al. |
| 2007/0190722 | A1 | 8/2007 | Herner |
| 2007/0238319 | A1 | 10/2007 | Jewell-Larsen et al. |
| 2008/0070162 | A1 | 3/2008 | Ufert |
| 2008/0142776 | A1 | 6/2008 | Seidl |
| 2008/0157257 | A1 | 7/2008 | Bertin et al. |
| 2008/0165574 | A1 | 7/2008 | Kim et al. |
| 2008/0182408 | A1 | 7/2008 | Lee et al. |
| 2008/0233744 | A1* | 9/2008 | Kaul et al. ............ 438/684 |
| 2009/0001343 | A1 | 1/2009 | Schricker et al. |
| 2009/0001345 | A1 | 1/2009 | Schricker et al. |
| 2009/0166609 | A1 | 7/2009 | Schricker et al. |
| 2009/0166610 | A1 | 7/2009 | Schricker et al. |
| 2009/0168491 | A1* | 7/2009 | Schricker et al. ......... 365/148 |
| 2009/0256130 | A1 | 10/2009 | Schricker |
| 2009/0256131 | A1* | 10/2009 | Schricker ............... 257/4 |

FOREIGN PATENT DOCUMENTS

| | | |
|---|---|---|
| EP | 1 892 722 | 2/2008 |
| JP | 2005-072171 | 3/2005 |
| JP | 2005-229019 | 8/2005 |
| JP | 2006-092746 | 4/2006 |
| JP | 2007-067374 | 3/2007 |
| JP | 2007-103529 | 4/2007 |
| JP | 2007-525030 | 8/2007 |
| JP | 2007-535106 | 11/2007 |
| TW | 200703617 | 1/1995 |
| TW | 200502982 | 1/2005 |
| TW | 200619906 | 6/2006 |
| WO | WO 2006-061599 | 6/2006 |
| WO | WO 2006/102391 A2 | 9/2006 |
| WO | WO 2006-121837 A2 | 11/2006 |
| WO | WO 2006-122111 | 11/2006 |
| WO | WO 2006-133949 | 12/2006 |
| WO | WO 2007/053180 | 5/2007 |
| WO | WO 2008-021900 | 2/2008 |
| WO | WO 2008/118486 | 10/2008 |

OTHER PUBLICATIONS

Office Action of related Japanese Patent Application Serial No. 2010-540945 dated Jul. 23, 2013.
Office Action in related Chinese Patent Application No. 200880123685.1 dated Oct. 10, 2012.
Feb. 24, 2012 Response to Aug. 26, 2011 Communication pursuant to Article 94(3) EPC in related European Patent Application No. 08869555.6.
Notice of Allowance of related U.S. Appl. No. 11/968,154 Apr. 11, 2012.
Feb. 18, 2013 Reply to Oct. 10, 2012 Office Action in related Chinese Patent Application No. 200880123685.1.
Uchino et al., "Catalyst Free Low Temperature Direct Growth of Carbon Nanotubes", Jul. 2005, Proceedings of 2005 5th IEEE Conference on Nanotechnology, pp. 1-4.
Smith et al., "Polishing TiN for Nanotube Synthesis", Nov. 2001, Proceedings of the 16th Annual Meeting of the American Society for Precision Engineering, pp. 1-4.
Li et al., "Bottom-up Approach for Carbon Nanotube Interconnects", Apr. 14, 2003, Applied Physics Letters, vol. 82, No. 15, pp. 2491-2493.
Srivastava et al., "Carbon Nanotube Interconnects: Implications for Performance, Power Dissipation and Thermal Management", 2005, IEEE, pp. 1-4.
Nozaki et al., "Fabrication of Vertically Aligned Single-Walled Carbon Nanotubes in Atmospheric Pressure Non-Thermal Plasma CVD", 2006, Science Direct—Carbon 45 (2007), pp. 364-374.
Shin et al., "Influence of Morphology of Catalyst Thin Film on Vertically Aligned Carbon Nanotube Growth", Science Direct—Journal of Crystal Growth 271 (2004), pp. 81-89.
Abdi et al., "PECVD-Grown Carbon Nanotubes on Silicon Substrates with a Nickel-Seeded Tip-Growth Structure", Science Direct—Materials Science and Engineering C 26 (2006), pp. 1219-1223.
Herner et al., "Polysilicon Memory Switching: Electrothermal-Induced Order", Sep. 2006, IEEE Transactions on Electron Devices, vol. 53, No. 9, pp. 2320-2327.
Herner et al., "Vertical p-i-n. Polysilicon Diode With Antifuse for Stackable Field-Programmable ROM", May 2004, IEEE Electron Device Letters, vol. 25, No. 5, pp. 271-273.
Rao et al., "In Situ-Grown Carbon Nanotube Array with Excellent Field Emission Characteristics", Jun. 19, 2000, Applied Physics Letters, vol. 76, No. 25, pp. 3813-3815.
Meyyappan et al., "Carbon Nanotube Growth by PECVD: a Review", Plasma Sources Sci. Technol. 12 (2003), pp. 205-216.
Choi et al., "Ultrahigh-density Nanotransistors by using Selectively Grown Vertical Carbon Nanotubes", Nov. 26, 2001, Applied Physics Letters, vol. 79, No. 22, pp. 3696-3698.
Malhi et al., "Characteristics and three-dimensional intergration of MOSFETs in small grain LPCVD polysilicon," IEEE J. Solid State Circuits, vol. SSC-20, pp. 178-201, Feb. 1985.
Son et al., "Electrical Switching in Metallic Carbon Nanotubes", Physical Review Letters, vol. 95, Issue 21, ID 216602, 2005.
International Search Report and Written Opinion of International Application No. PCT/US2008/088584 mailed Jul. 23, 2009.
Subramanian et al., "High-Performance Germanium-Seeded Laterally Crystallized TFTs for Vertical Device Integration," Electron Devices, IEEE Transactions; Publication Date: Sep. 1998, vol. 45, Issue 9, pp. 1934-1939.
Office Action of U.S. Appl. No. 11/968,154 mailed Nov. 4, 2010.
Supplementary European Search Report & Examiner's WrO of EP Application No. 08869555.6 dtd Nov. 11, 2010.
Communication pursuant to Rules 70(2) and 70a(2) EPC of European Patent Application No. 08869555.6 dtd Dec. 23, 2010.

(56) References Cited

OTHER PUBLICATIONS

Feb. 4, 2011 Reply to Nov. 4, 2010 Office Action of related U.S. Appl. No. 11/968,154.

Office Action of related U.S. Appl. No. 11/968,154 mailed Apr. 14, 2011.

Ago et al., "Workfunction of Purified and Oxidised Carbon Nanotubes," Synthetic Metals, vol. 103, pp. 2494-2495 (1999).

Jul. 14, 2011 Reply to Apr. 14, 2011 Office Action of related U.S. Appl. No. 11/968,154.

Jun. 22, 2011 Reply to the Dec. 23, 2010 Communication pursuant to Rules 70(2) and 70a(2) EPC of related European Patent Application No. 08869555.6.

Communication pursuant to Article 94(3) EPC in related European Patent Application No. 08869555.6 dated Aug. 26, 2011.

Notice of Allowance of related U.S. Appl. No. 11/968,154 Oct. 18, 2011.

Jang, J.E. et al. "Nanoelectromechanical switches with vertically aligned carbon nanotubes", Applied Physics Letters, vol. 87, (2005) pp. 163114-1-163114-3.

Supplemental Notice of Allowance of related U.S. Appl. No. 11/968,154 Nov. 21, 2011.

Oct. 28, 2013 Response to Jul. 23, 2013 Office Action of related Japanese Patent Application Serial No. 2010-540945.

Decision of Refusal of related Japanese Patent Application Serial No. 2010-540945 dated Nov. 26, 2013.

Office Action & Search Report of related Taiwanese Patent Application Serial No. 097151907 dated Jan. 21, 2014.

Office Action of related Korean Patent Application No. 2010-7013893 dated Jul. 25, 2014.

* cited by examiner

US 8,878,235 B2

MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME

REFERENCE TO RELATED APPLICATIONS

This application is a continuation-in-part of U.S. patent application Ser. No. 11/968,154, filed Dec. 31, 2007, and titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME," which is hereby incorporated by reference herein in its entirety for all purposes.

This application is related to the following patent applications, each of which is hereby incorporated by reference herein in its entirety for all purposes:

U.S. patent application Ser. No. 11/968,156, filed Dec. 31, 2007, and titled "MEMORY CELL THAT EMPLOYS A SELECTIVELY FABRICATED CARBON NANO-TUBE REVERSIBLE RESISTANCE-SWITCHING ELEMENT FORMED ON A BOTTOM CONDUCTOR AND METHODS OF FORMING THE SAME."

U.S. patent application Ser. No. 11/968,159, filed Dec. 31, 2007, and titled "MEMORY CELL WITH PLANARIZED CARBON NANOTUBE LAYER AND METHODS OF FORMING THE SAME."

BACKGROUND

The present invention relates to non-volatile memories and more particularly to a memory cell that employs a selectively fabricated carbon nano-tube ("CNT") reversible resistance-switching element and methods of forming the same.

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety, describes a rewriteable non-volatile memory cell that includes a diode coupled in series with a reversible resistivity-switching material such as a metal oxide or metal nitride.

However, fabricating memory devices from rewriteable resistivity-switching materials is technically challenging; and improved methods of forming memory devices that employ resistivity-switching materials are desirable.

SUMMARY

In a first aspect of the invention, a method is provided that includes fabricating a steering element above a substrate, and fabricating a reversible-resistance switching element coupled to the steering element by selectively fabricating CNT material above the substrate, wherein the CNT material comprises a single CNT.

In a second aspect of the invention, a memory cell is provided that includes a steering element, and a reversible resistance-switching element coupled to the steering element. The reversible resistance-switching element includes a selectively fabricated CNT material, wherein the CNT material includes a single CNT.

In a third aspect of the invention, a monolithic three dimensional memory array is provided that includes a first memory level formed above a substrate, and at least a second memory level monolithically formed above the first memory level. The first memory level includes a plurality of memory cells, wherein each memory cell of the first memory level includes a steering element and a reversible resistance-switching element coupled to the steering element. The reversible resistance-switching element includes a selectively fabricated CNT material, wherein the CNT material includes a single CNT.

Numerous other aspects are provided in accordance with these and other embodiments of the invention. Other features and aspects of the present invention will become more fully apparent from the following detailed description, the appended claims and the accompanying drawings.

DETAILED DESCRIPTION

Figure 1:
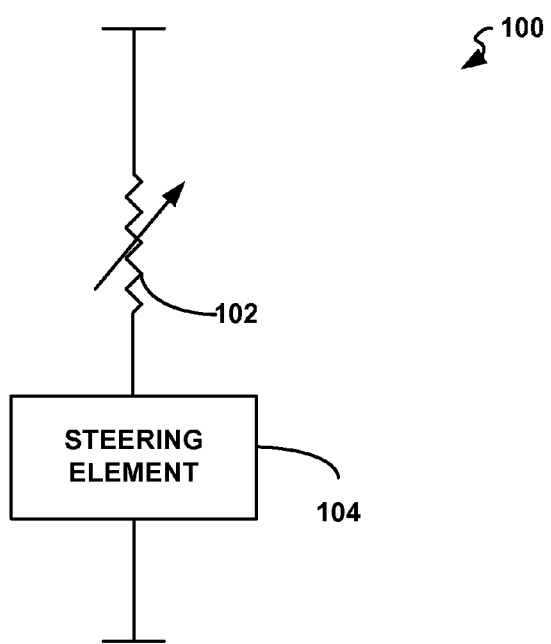
FIG. 1 is a schematic illustration of an example memory cell provided in accordance with the present invention.

Some CNT materials have been shown to exhibit reversible resistivity-switching properties that may be suitable for use in non-volatile memories. However, the thin film of deposited or grown CNT material has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits.

In accordance with the present invention, difficult-to-etch, CNT rewriteable resistivity-switching materials may be used within a memory cell without being etched. In an example embodiment, a memory cell is provided that includes a CNT reversible resistivity-switching material formed by: (1) depositing or forming a CNT seeding layer; (2) patterning and etching the CNT seeding layer; and (3) selectively fabricating CNT material on the patterned and etched CNT seeding layer. The CNT seeding layer may be a layer that facilitates CNT formation, such as a surface-roughened and/or conducting layer. Selective formation of CNT material on the CNT seeding layer can eliminate or minimize the need to etch the CNT material.

In another example embodiment, a memory cell is provided that includes a CNT reversible resistivity-switching material formed by: (1) depositing or forming a CNT seeding layer; (2) patterning and etching the CNT seeding layer; (3) surface-roughening the patterned and etched CNT seeding layer; (4) forming a dielectric layer over the surface-roughened CNT seeding layer; (5) patterning and etching the dielectric layer to create an opening or void to expose the CNT seeding layer; and (6) selectively fabricating a single CNT in the opening or void on the exposed, surface-roughened CNT seeding layer.

In still another exemplary embodiment, a memory cell is provided that includes a CNT reversible resistivity-switching material formed by: (1) depositing or forming a conductive layer; (2) forming a dielectric layer over the conductive layer; (3) patterning and etching the dielectric layer to create an opening or void to expose the conductive layer; (4) forming or depositing a CNT seeding particle in the opening or void; and (5) selectively fabricating a single CNT on the CNT seeding particle.

In alternative embodiments of the invention, the selectively fabricated single CNT may include a first portion that operates as reversible resistance-switching element, and a second portion that operates as a p-n or a p-i-n diode. The first (switching) portion may be above or below the second (diode) portion of the selectively fabricated single CNT.

Example CNT seeding layers include titanium nitride, tantalum nitride, nickel, cobalt, iron, titanium, molybdenum or the like. In some embodiments, a titanium nitride or tantalum nitride layer may be surface-roughened for use as a CNT seeding layer. Such surface-roughened titanium nitride or tantalum nitride may itself serve as a CNT seeding layer.

In other embodiments, CNT seeding layers include a surface-roughened titanium or tantalum nitride layer coated with a metal catalyst layer to facilitate CNT material formation. Such a metal catalyst layer may be patterned and etched with the titanium or tantalum nitride layer, or selectively deposited on the titanium nitride or tantalum nitride layer after the titanium nitride or tantalum nitride layer is patterned and etched. Example metal catalyst layers include nickel, cobalt, iron, titanium, molybdenum, etc. In still other embodiments, CNT seeding layers include only a metal catalyst layer (e.g., without including an underlying surface-roughened titanium nitride or tantalum nitride layer).

Example CNT seeding particles include nickel, cobalt, iron, titanium, molybdenum or other similar metal catalyst particles. In some embodiments, one or more CNT seeding particles may be formed on a smooth or a surface-roughened titanium nitride or tantalum nitride layer.

As used herein, CNT material refers to material that includes one or more single and/or multi-wall CNTs. In some embodiments, the individual tubes of the CNT material may be vertically aligned. Vertically aligned CNTs allow vertical current flow with little or no lateral conduction. In some embodiments, the individual tubes of the CNT material may be fabricated to be substantially vertically aligned to reduce or prevent the formation of lateral or bridging conduction paths between adjacent memory cells. This vertical alignment reduces and/or prevents the state of a memory cell from being influenced or "disturbed" by the state and/or programming of adjacent memory cells.

Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined. Example techniques for forming CNT materials are described below.

Example Inventive Memory Cell

FIG. 1 is a schematic illustration of an example memory cell 100 provided in accordance with the present invention. Memory cell 100 includes a reversible resistance-switching element 102 coupled to a steering element 104.

Reversible resistance-switching element 102 includes a reversible resistivity-switching material (not separately shown) having a resistivity that may be reversibly switched between two or more states. For example, the reversible resistivity-switching material of element 102 may be in an initial, low-resistivity state upon fabrication. Upon application of a first voltage and/or current, the material is switchable to a high-resistivity state. Application of a second voltage and/or current may return the reversible resistivity-switching material to a low-resistivity state.

Alternatively, reversible resistance-switching element 102 may be in an initial, high-resistance state upon fabrication that is reversibly switchable to a low-resistance state upon application of the appropriate voltage(s) and/or current(s). When used in a memory cell, one resistance state may represent a binary "0" while another resistance state may represent a binary "1," although more than two data/resistance states may be used. Numerous reversible resistivity-switching materials and operation of memory cells employing reversible resistance-switching elements are described, for example, the '939 Application, previously incorporated.

In at least one embodiment of the invention, reversible resistance-switching element 102 is formed using a selectively deposited or grown CNT material. As will be described further below, use of a selectively formed CNT material eliminates the need to etch the CNT material. Fabrication of reversible resistance-switching element 102 thereby is simplified.

Steering element 104 may include a thin film transistor, a diode, or another suitable steering element that exhibits non-ohmic conduction by selectively limiting the voltage across and/or the current flow through reversible resistance-switching element 102. In this manner, memory cell 100 may be used as part of a two or three dimensional memory array and data may be written to and/or read from memory cell 100 without affecting the state of other memory cells in the array.

Example embodiments of memory cell 100, reversible resistance-switching element 102 and steering element 104 are described below with reference to FIGS. 2A-7.

First Example Embodiment of a Memory Cell

Figure 2A:
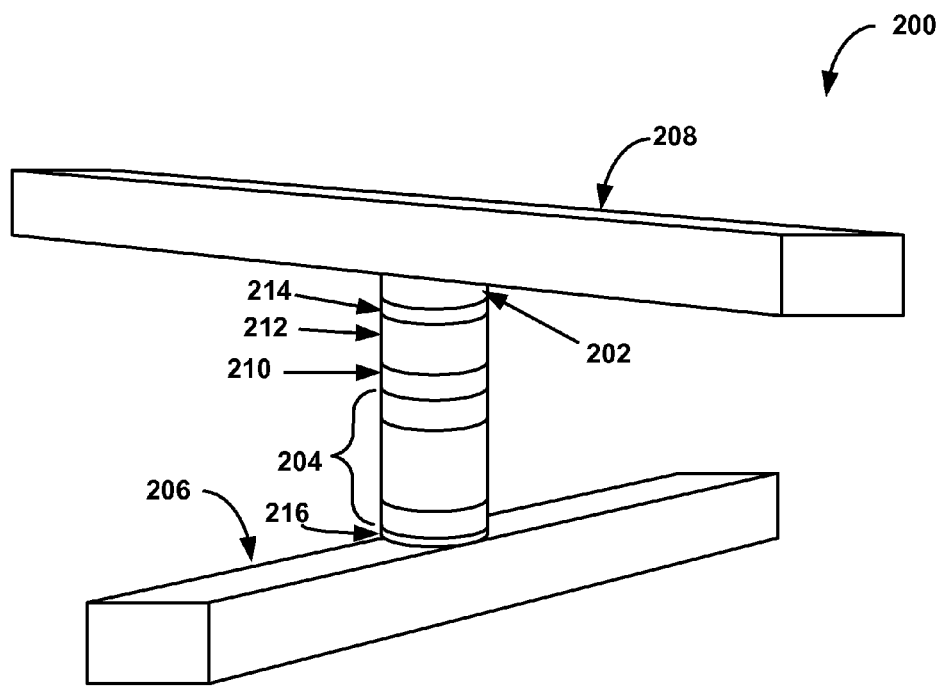
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, memory cell 200 includes a reversible resistance-switching element 202 coupled in series with a diode 204 between a first conductor 206 and a second conductor 208.

In some embodiments, a barrier layer 210, a conductive layer 212 and/or a CNT seeding layer 214 may be formed between reversible resistance-switching element 202 and diode 204. For example, barrier layer 210 may include titanium, titanium nitride, tantalum, tantalum nitride, tungsten, tungsten nitride, molybdenum, etc., and conductive layer 212 may include tungsten or another suitable metal layer.

In some embodiments, CNT seeding layer 214 may include a conducting layer that promotes CNT material formation, such as titanium nitride, tantalum nitride, nickel, cobalt, iron, titanium, molybdenum or the like. In one example embodiment, CNT seeding layer 214 may be titanium nitride or tantalum nitride with a surface-roughened by chemical mechanical polishing ("CMP") or another suitable process.

In other embodiments, CNT seeding layer 214 may include a metal catalyst layer of nickel, cobalt, iron, titanium, molybdenum, etc., that promotes CNT material formation deposited or formed on a surface-roughened or smooth titanium nitride, tantalum nitride or similar layer. In still other embodiments, CNT seeding layer 214 may be a metal catalyst layer such as nickel, cobalt, iron, titanium, molybdenum or the like that promotes CNT formation.

Although not shown in FIG. 2A, in some embodiments, CNT seeding layer 214 may include one or more metal catalyst particles that promote CNT material formation, such as nickel, cobalt, iron, titanium, molybdenum or the like. In some embodiments, CNT seeding layer 214 may include one or more metal catalyst seed particles of nickel, cobalt, iron, titanium, molybdenum, etc., that promote CNT material formation deposited or formed on a surface-roughened or smooth titanium nitride, tantalum nitride or similar layer.

As will be described further below, barrier layer 210, conductive layer 212 and/or CNT seeding layer 214 may serve as a hard mask during formation of diode 204. Use of metal hard masks is described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 Application") which is hereby incorporated by reference herein in its entirety. An additional barrier layer 216, such as titanium, titanium nitride, tantalum, tantalum nitride, tungsten, tungsten nitride, molybdenum, etc., also may be formed between diode 204 and first conductor 206.

Patterning of CNT seeding layer 214 with conductive layer 212, barrier layer 210, diode 204 and/barrier layer 216 simplifies fabrication of memory cell 200 as additional patterning and etch steps are not required for CNT seeding layer 214. Further, CNT material will selectively (e.g., only) form on the patterned and etched CNT seeding layer 214 so that etching of CNT material is not required. The selectively formed CNT material serves as reversible resistance-switching element 202. In some embodiments, only a portion, such as one or more filaments, of the CNT material that forms reversible resistance-switching element 202 may switch and/or be switchable.

Diode 204 may include any suitable diode, such as a vertical p-n or p-i-n diode, whether upward pointing with an n-region above a p-region of the diode or downward pointing with a p-region above an n-region of the diode. As described in more detail below, diode 204 may be a semiconductor diode, such as a polycrystalline semiconductor diode, or may be a CNT-based diode (referred to in the remaining description as a "CNT diode"). Example embodiments of diode 204 are described below with reference to FIGS. 3A-3E.

First and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first and/or second conductors 206, 208 to improve device performance and/or aid in device fabrication.

Figure 2B:
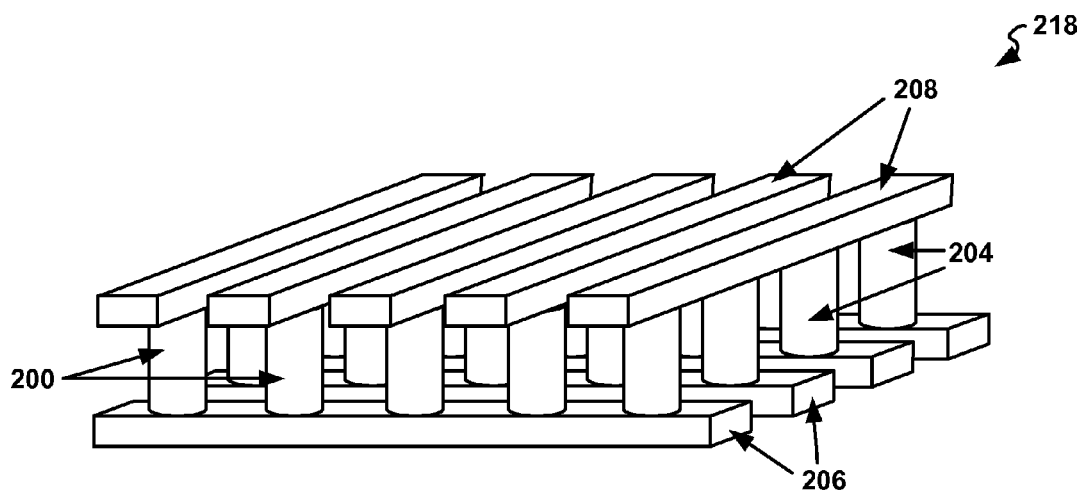
FIG. 2B is a simplified perspective view of a portion of a first memory level formed from a plurality of the memory cells of FIG. 2A.

FIG. 2B is a simplified perspective view of a portion of a first memory level 218 formed from a plurality of memory cells 200 of FIG. 2A. For simplicity, reversible resistance-switching element 202, CNT seeding layer 214, diode 204, barrier layers 210 and 216 and conductive layer 212 are not separately shown. Memory array 218 is a "cross-point" array including a plurality of bit lines (second conductors 208) and word lines (first conductors 206) to which multiple memory cells are coupled (as shown). Other memory array configurations may be used, as may multiple levels of memory.

Figure 2C:
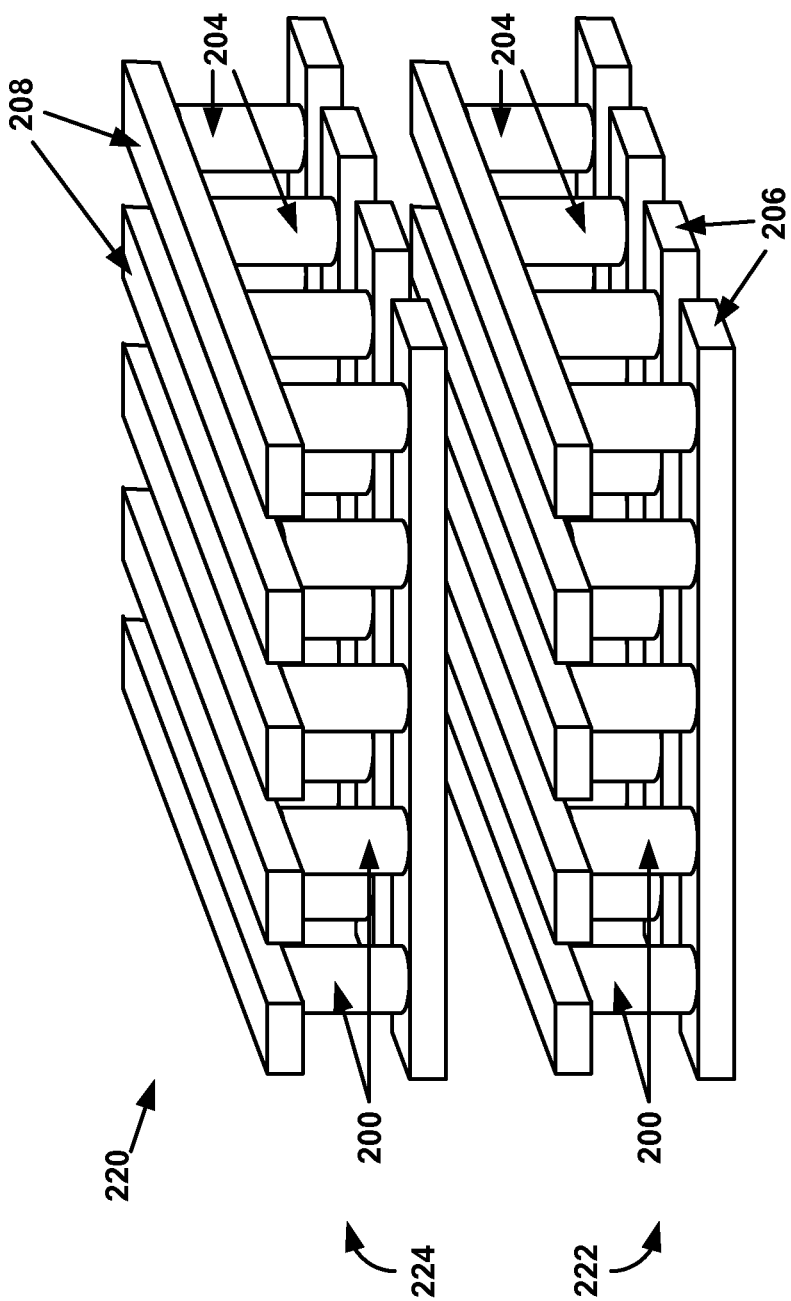
FIG. 2C is a simplified perspective view of a portion of a first example three dimensional memory array provided in accordance with the present invention.

For example, FIG. 2C is a simplified perspective view of a portion of a monolithic three dimensional array 220 that includes a first memory level 222 positioned below a second memory level 224. In the embodiment of FIG. 2C, each memory level 222, 224 includes a plurality of memory cells 200 in a cross-point array. It will be understood that additional layers (e.g., an interlevel dielectric) may be present between first and second memory levels 222 and 224, but are not shown in FIG. 2C for simplicity.

Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
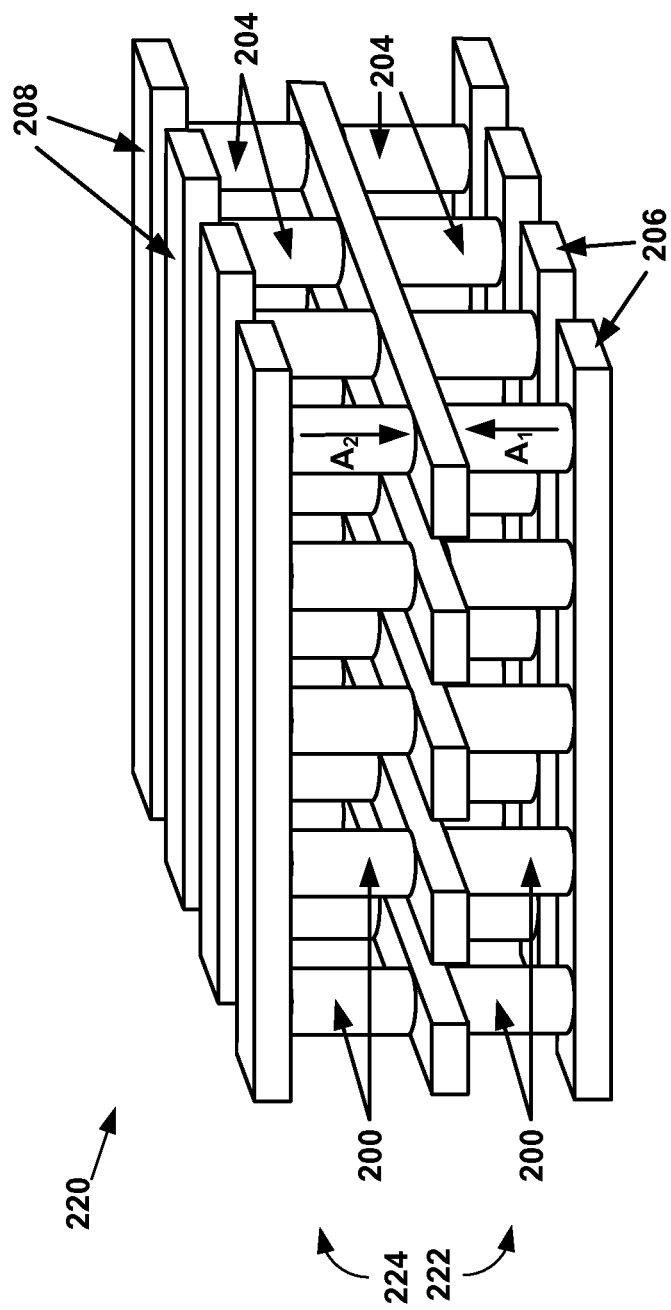
FIG. 2D is a simplified perspective view of a portion of a second example three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the second conductors of a first memory level may be used as the first conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "LARGE ARRAY OF UPWARD POINTING P-I-N DIODES HAVING LARGE AND UNIFORM CURRENT" (hereinafter "the '151 Application"), which is hereby incorporated by reference herein in its entirety for all purposes.

For example, the diodes of first memory level 222 may be upward pointing diodes as indicated by arrow $A_1$ (e.g., with p regions at the bottom of the diodes), while the diodes of second memory level 224 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "THREE DIMENSIONAL STRUCTURE MEMORY." The substrates may be thinned or removed from the memory levels before bonding, but as the memory levels are initially formed over separate substrates, such memories are not true monolithic three dimensional memory arrays.

Figure 3A:
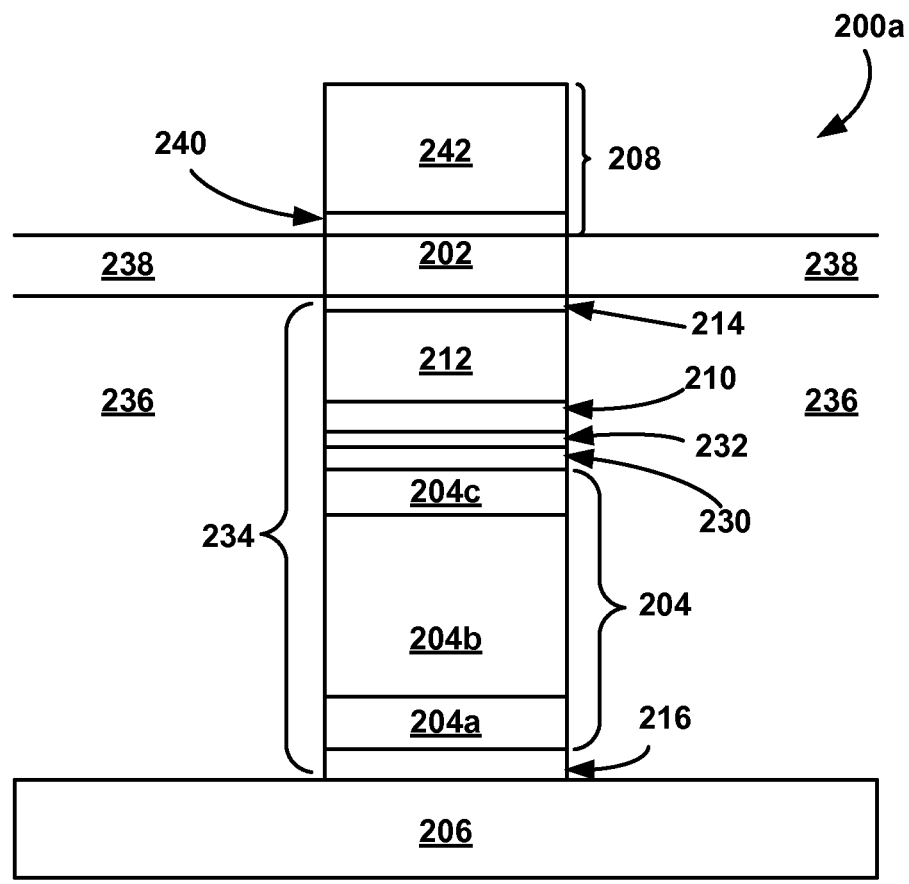
FIG. 3A is a cross-sectional view of a first example embodiment of the memory cell of FIG. 2A.

FIG. 3A is a cross-sectional view of a first example embodiment of a memory cell 200a in accordance with this invention. With reference to FIG. 3A, memory cell 200a includes reversible resistance-switching element 202, diode 204 and first and second conductors 206, 208.

As previously stated, diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 204 may be formed from a polycrystalline semiconductor material such as polysilicon, a polycrystalline silicon-germanium alloy, polygermanium or any other suitable material. For example, referring again to FIG. 3A, diode 204 may include a heavily doped n+ polysilicon region 204a, a lightly doped or an intrinsic (unintentionally doped) polysilicon region 204b above n+ polysilicon region 204a and a heavily doped, p+ polysilicon region 204c above intrinsic region 204b. As described in more detail below, in some embodiments, diode 204 alternatively may be formed from a CNT material.

In some embodiments, a thin germanium and/or silicon-germanium alloy layer (not shown) may be formed on n+ polysilicon region 204a to prevent and/or reduce dopant migration from n+ polysilicon region 204a into intrinsic region 204b. Use of such a layer is described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 Application"), which is hereby incorporated by reference herein in its entirety for all purposes. In some embodiments, a few hundred angstroms or less of silicon-germanium alloy with about 10 at % or more of germanium may be employed.

It will be understood that the locations of the n+ and p+ regions may be reversed. A barrier layer 216, such as titanium, titanium nitride, tantalum, tantalum nitride, tungsten, tungsten nitride, molybdenum, etc., may be formed between first conductor 206 and n+ region 204a (e.g., to prevent and/or reduce migration of metal atoms into the polysilicon regions).

When diode 204 is fabricated from deposited silicon (e.g., amorphous or polycrystalline), a silicide layer 230 may be formed on diode 204 to place the deposited silicon in a low resistivity state, as fabricated. Such a low resistivity state allows for easier programming of memory cell 200a as a large voltage is not required to switch the deposited silicon to a low resistivity state.

For example, a silicide-forming metal layer 232 such as titanium or cobalt may be deposited on p+ polysilicon region 204c. During a subsequent anneal step (described below) employed to crystallize the deposited silicon that forms diode 204, silicide-forming metal layer 232 and the deposited silicon of diode 204 interact to form silicide layer 230, consuming all or a portion of silicide-forming metal layer 232.

As described in U.S. Pat. No. 7,176,064, "MEMORY CELL COMPRISING A SEMICONDUCTOR JUNCTION DIODE CRYSTALLIZED ADJACENT TO A SILICIDE," which is hereby incorporated by reference herein in its entirety, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., silicide layer 230 enhances the crystalline structure of silicon diode 204 during annealing). Lower resistivity silicon thereby is provided. Similar results may be achieved for silicon-germanium alloy and/or germanium diodes.

In the embodiment of FIG. 3A, reversible resistance-switching element 202 is formed by a selective fabrication process in which CNT material is formed on a patterned and etched CNT seeding layer 214. Example CNT seeding layer materials include titanium nitride or tantalum nitride and/or nickel, cobalt, iron, titanium, molybdenum or another suitable metal and/or catalyst. In some embodiments, CNT seeding layer 214 may be a single layer of roughened metal nitride, such as surface-roughened titanium nitride or tantalum nitride, or may be a single layer of a metal catalyst such as nickel, cobalt, iron, titanium, molybdenum, etc.

In some embodiments, CNT seeding layer 214 and reversible resistance-switching element 202 may be formed over conductive silicide-forming metal layer 232. In such embodiments, CNT seeding layer 214 and silicide-forming metal layer 232 may be patterned and etched during formation of diode 204 as described below with reference to FIGS. 4A-4D. In other embodiments, a metal hard mask may be formed over silicide-forming metal layer 232 prior to formation of CNT seeding layer 214 and resistance-switching element 202.

For example, a barrier layer 210 and/or a conductive layer 212 may be formed over silicide-forming metal layer 232. CNT seeding layer 214 then may be formed over conductive layer 212. Barrier layer 210 may include titanium, titanium nitride, tantalum, tantalum nitride, tungsten, tungsten nitride, molybdenum, etc., and conductive layer 212 may include tungsten or another suitable metal layer.

As will be described further below, barrier layer 210 and/or conductive layer 212, as well as CNT seeding layer 214, may serve as a hard mask during formation of diode 204 and may mitigate any over-etching that may occur during formation of second conductor 208 (as described in the '936 Application, previously incorporated).

For example, CNT seeding layer 214, barrier layer 210 and conductive layer 212 may be patterned and etched, and then serve as a mask during etching of diode 204. Etching of CNT seeding layer 214, conductive layer 212, barrier layer 210, silicide-forming metal layer 232, diode 204 (p+ polysilicon layer 204c, intrinsic layer 204b, n+ polysilicon layer 204a) and barrier layer 216 creates a pillar structure 234.

Dielectric material 236 is deposited on top of and around pillar structure 234 to isolate pillar structure 234 from other similar pillar structures of other memory cells (not shown) fabricated on a memory level that includes memory cell 200a. A CMP or dielectric etchback step then is performed to planarize dielectric material 236 and remove the dielectric material from the top of CNT seeding layer 214.

Such a CMP or dielectric etchback step may also roughen the surface of CNT seeding layer 214. For example, in some embodiments, CNT seeding layer 214 may include titanium nitride that is roughened by the CMP or dielectric etchback step just described and/or by an additional roughening step. Such a roughened, titanium nitride surface may be employed as a seeding surface for CNT fabrication.

For example, roughened titanium nitride has been shown to facilitate formation of vertically aligned CNTs, as described by Smith et al., "Polishing TiN for Nanotube Synthesis," Proceedings of the 16th Annual Meeting of the American Society for Precision Engineering, November 2001. (See also Rao et al., "In situ-grown carbon nanotube array with excellent field emission characteristics," Applied Phy. Letters, 76:25, Jun. 19, 2000, pp. 3813-3815).

As an example, CNT seeding layer 214 may be about 1000 to about 5000 angstroms of a metal nitride, such as titanium nitride or tantalum nitride, with an arithmetic average surface roughness Ra of about 850 to about 4000 angstroms, and more preferably about 4000 angstroms.

In still other embodiments, CNT seeding layer 214 may include about 1 to about 200 angstroms, and more preferably about 20 angstroms or less, of a metal catalyst layer such as nickel, cobalt, iron, titanium, molybdenum, etc. The nickel, cobalt, iron, titanium, molybdenum or other metal catalyst layer may be a continuous or non-continuous film. Other materials, thicknesses and surface roughness conditions may be used.

Following planarization of dielectric material 236, a CNT fabrication process is performed to selectively grow and/or deposit CNT material on CNT seeding layer 214. The grown or deposited CNT material serves as reversible resistance-switching element 202. For simplicity, the grown or deposited CNT material will be referred to in the remaining discussion as "CNT material 202."

Any suitable method may be used to form CNT material 202 on CNT seeding layer 214. For example, chemical vapor deposition ("CVD"), plasma-enhanced CVD ("PECVD"), laser vaporization, electric arc discharge or the like may be employed. In one example embodiment, CNTs may be formed on a surface-roughened TiN CNT seeding layer 214 by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another example embodiment, CNTs may be formed on a nickel catalyst CNT seeding layer 214 by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst CNT seeding layer 214 such as nickel, cobalt, iron, titanium, molybdenum, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 202 forms only over CNT seeding layer 214 of pillar structure 234 (and other similar pillar structures (not shown) of other memory cells fabricated on a memory level that includes memory cell 200a). In some embodiments, CNT material 202 may have a thickness of about 1 nanometers to about 1 micron (and even tens of microns), and more preferably about 10 to about 20 nanometers, although other CNT material thicknesses may be used.

The density of the individual tubes in CNT material 202 may be, for example, about $6.6\times10^3$ to about $1\times10^6$ CNTs/$micron^2$, and more preferably at least about $6.6\times10^4$ CNTs/$micron^2$, although other densities may be used. For example, assuming pillar structure 234 has a width of about 45 nanometers, in some embodiments, it is preferred to have at least about 10 CNTs, and more preferably at least about 100 CNTs, in CNT material 202 (although fewer CNTs, such as 1, 2, 3, 4, 5, etc., or more CNTs, such as more than 100, may be employed). Indeed, as described in more detail below, in some embodiments in which pillar structure 234 has a width of less than about 10 nanometers, it is desirable that CNT material 202 includes a single CNT.

To improve the reversible resistivity-switching characteristics of CNT material 202, in some embodiments it may be preferable that at least about 50%, and more preferably at least about ⅔, of the carbon nano-tubes of CNT material 202 are semiconducting. As multiple wall CNTs are generally metallic while single wall CNTs may be metallic or semiconducting, in one or more embodiments, it may be preferable for CNT material 202 to include primarily semiconducting single wall CNTs. In other embodiments, fewer than 50% of the CNTs of CNT material 202 may be semiconducting.

Vertically aligned CNTs allow vertical current flow with little or no lateral conduction. To prevent the formation of lateral or bridging conduction paths between adjacent pillar structures 234, in some embodiments, individual tubes of CNT material 202 may be fabricated to be substantially vertically aligned (e.g., thereby reducing and/or preventing the state of a memory cell from being influenced or "disturbed" by the state and/or programming of adjacent memory cells).

Note that this vertical alignment may or may not extend over the entire thickness of CNT material 202. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in CNT material 202 to improve or otherwise tune the reversible resistivity-switching characteristics of CNT material 202. For example, after CNT material 202 has been formed on CNT seeding layer 214, argon, nitrogen, oxygen, or another species may be implanted into CNT material 202 to create defects in CNT material 202. In a second example, CNT material 202 may be subjected or exposed to an argon or $O_2$ plasma (biased or chemical) to intentionally create defects in CNT material 202.

Following formation of CNT material 202, dielectric material 238 is deposited on top of and around CNT material 202 to isolate CNT material 202 from other similar CNT material regions of other memory cells (not shown) fabricated on a memory level that includes memory cell 200a. A CMP or dielectric etchback step then is performed to planarize dielectric material 238 and remove the dielectric material from the top of CNT material 202.

Following planarization of dielectric material 238, second conductor 208 is formed. In some embodiments, one or more barrier layers and/or adhesion layers 240 may be formed over CNT material 202 prior to deposition of a conductive layer 242. Conductive layer 242 and barrier layer 240 may be patterned and/or etched together to form second conductor 208. In some embodiments, second conductor 208 may be formed using a damascene process as described below with reference to FIGS. 4A-4D.

Following formation of second conductor 208, memory cell 200a may be annealed to crystallize the deposited semiconductor material of diode 204 (and/or to form silicide layer 230). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, silicide layer 230 may serve as a "crystallization template" or "seed" during annealing for underlying deposited semiconductor material that forms diode 204. Lower resistivity diode material thereby is provided.

Figure 3B:
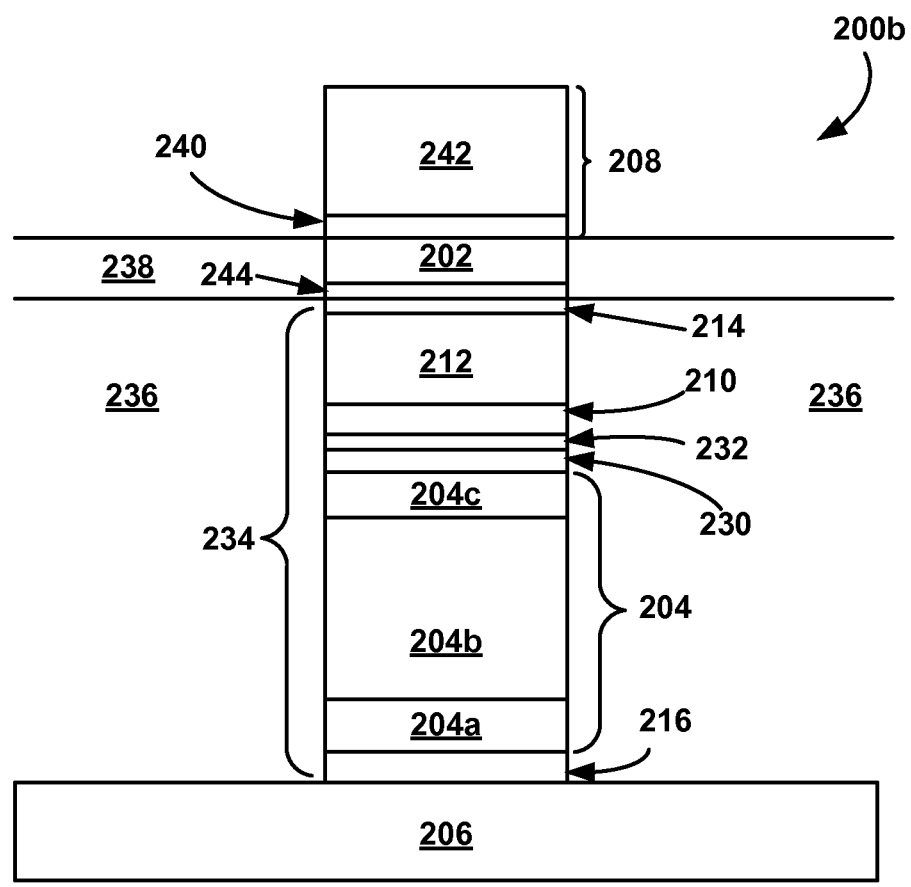
FIG. 3B is a cross-sectional view of a second example embodiment of the memory cell of FIG. 2A.

In some embodiments, CNT seeding layer 214 may include one or more additional layers. For example, FIG. 3B is a cross-sectional view of a second example embodiment of a memory cell 200b in accordance with this invention, in which CNT seeding layer 214 includes a metal catalyst layer 244. Metal catalyst layer 244 may be selectively deposited over the CMP or etchback-exposed CNT seeding layer 214.

For instance, in some embodiments, a nickel, cobalt, iron, titanium, molybdenum, etc., metal catalyst layer 244 may be selectively formed over a surface-roughened titanium or tantalum nitride CNT seeding layer 214 by electroless deposition, electroplating or the like. CNT material 202 then may be formed over metal catalyst coated CNT seeding layer 214.

In example embodiments, CNT seeding layer 214 may include about 20 to about 500 angstroms of smooth or surface-roughened titanium, tantalum or similar metal nitride coated with metal catalyst layer 244 including about 1 to about 200 angstroms, and more preferably about 20 angstroms or less, of nickel, cobalt, iron, titanium, molybdenum, etc. The nickel, cobalt, iron, titanium, molybdenum or other metal catalyst layer may be a continuous or non-continuous film.

In some embodiments, use of metal catalyst layer 244 may eliminate the need for a catalyst precursor during CNT formation. Example metal catalyst layer thicknesses range from about 1 to 200 angstroms, although other thicknesses may be used. Such an embodiment may be used with or without metal hard mask layers 210 and 212.

As described above, in some embodiments, CNT material 202 includes fewer than 10 CNTs. Indeed, as device dimensions shrink (e.g., embodiments in which pillar structure 234 has a width less than about 10 nanometers), it is desirable that CNT material 202 includes a single CNT. For example, FIG. 3C is a cross-sectional view of a third example embodiment of a memory cell 200c in accordance with this invention, in which CNT material 202 includes a single CNT.

As device dimensions decrease, the number of outer walls of multi-wall CNTs can be reduced to reduce the cross-sectional area of each tube. For example, double-wall CNTs may be fabricated with a 2 nanometer diameter, and single-wall CNTs can be fabricated with a 1.4 nanometer diameter. Such diameters for single wall and double-wall CNTs and other CNT diameters below 5 nanometers are compatible with advanced scaling techniques (e.g., embodiments in which pillar structure 234 has a width less than about 5 nanometers).

Figure 3C:
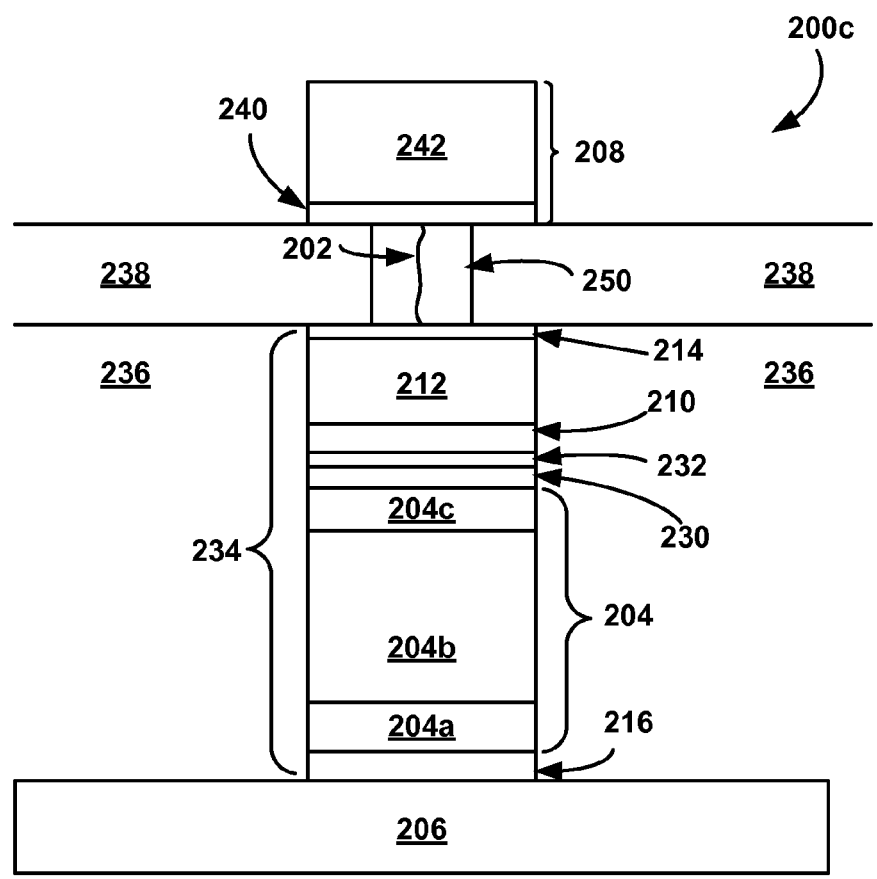
FIG. 3C is a cross-sectional view of a third example embodiment of the memory cell of FIG. 2A.

In the embodiment in FIG. 3C, CNT material 202 is formed on a CNT seeding layer 214 using a damascene process. Example CNT seeding layer 214 materials include titanium nitride or tantalum nitride and/or nickel, cobalt, iron, titanium, molybdenum or another suitable metal and/or catalyst. In some embodiments, CNT seeding layer 214 may be a single layer of roughened metal nitride, such as surface-roughened titanium nitride or tantalum nitride, or may be a single layer of a metal catalyst such as nickel, cobalt, iron, titanium, molybdenum, etc.

Dielectric material 236 is deposited on top of and around pillar structure 234 to isolate pillar structure 234 from other similar pillar structures of other memory cells (not shown) fabricated on a memory level that includes memory cell 200c. A CMP or dielectric etchback step may then be performed to planarize dielectric material 236 and remove the dielectric material from the top of CNT seeding layer 214.

Such a CMP or dielectric etchback step may also roughen the surface of CNT seeding layer 214. For example, in some embodiments, CNT seeding layer 214 may include titanium nitride that is roughened by the CMP or dielectric etchback step just described and/or by an additional roughening step. Such a roughened, titanium nitride surface may be employed as a seeding surface for CNT fabrication.

As an example, CNT seeding layer 214 may be about 1000 to about 5000 angstroms of a metal nitride, such as titanium nitride or tantalum nitride, with an arithmetic average surface roughness Ra of about 850 to about 4000 angstroms, and more preferably about 4000 angstroms.

In still other embodiments, CNT seeding layer 214 may include about 1 to about 200 angstroms, and more preferably about 20 angstroms or less, of a metal catalyst layer such as nickel, cobalt, iron, titanium, molybdenum, etc. The nickel, cobalt, iron, titanium, molybdenum or other metal catalyst layer may be a continuous or non-continuous film. Other materials, thicknesses and surface roughness conditions may be used.

Dielectric material 238 is then formed on planarized dielectric material 236 and CNT seeding layer 214. For example, dielectric material 238 may be between about 100 angstroms and about 2000 angstroms, more generally between about 10 angstroms and about 2 microns of silicon dioxide, silicon nitride, silicon oxynitride, or other similar insulating material. Other dielectric materials such as low K dielectrics, etc., and/or other dielectric layer thicknesses may be used. Example low K dielectrics include carbon doped oxides, silicon carbon layers, or the like. Dielectric material 238 may be formed by CVD, high density plasma, or other similar method.

Dielectric material 238 may then be patterned and etched to create openings or voids 250, which are substantially aligned with pillar structures 234, as shown in FIG. 3C. For example, dielectric material 238 may be covered with a photoresist and exposed. Appropriate BARC, DARC and/or APF hard masks may be deposited on dielectric material 238 prior to patterning. The exposed (or unexposed) photoresist may be removed, and dielectric material 238 in the exposed (or unexposed) areas etched away to define openings or voids 250. The etch continues until CNT seeding layer 214 is exposed at the bottom of openings or voids 250.

Various patterning techniques may be used to form openings or voids 250 in dielectric material 238. For example, imprint lithography, immersion lithography, extreme ultraviolet ("EUV") lithography, or other similar lithography techniques may be used to form openings or voids 250 having features (e.g., widths and lengths) less than about 10 nanometers.

Following formation of openings or voids 250, a CNT fabrication process is performed to selectively grow and/or deposit CNT material 202 on CNT seeding layer 214. By virtue of the narrow width of openings or voids 250, CNT material 202 preferably includes a single CNT.

Any suitable method may be used to form CNT material 202 on CNT seeding layer 214. For example, CVD, PECVD, laser vaporization, electric arc discharge or the like may be employed. In one example embodiment, a single CNT may be formed on a surface-roughened TiN CNT seeding layer 214 by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another example embodiment, a single CNT may be formed on a nickel catalyst CNT seeding layer 214 by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, a single CNT may be formed on a metal catalyst CNT seeding layer 214 such as nickel, cobalt, iron, titanium, molybdenum, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

For example, Table 1, below, illustrates example process ranges for forming CNT material 202 on CNT seeding layer 214 by CVD.

TABLE 1

Example CVD Process Parameters

| PROCESS PARAMETER | EXEMPLE RANGE | PREFERRED RANGE |
|---|---|---|
| Argon Flow Rate (sccm) | 0-400 | 2-60 |
| Hydrocarbon ($C_2H_4$ and or $CH_4$) Flow Rate (sccm) | 0.01-1500 | 10-1000 |
| $H_2$ Flow Rate (sccm) | 0-800 | 0-500 |
| Pressure (Torr) | 0.1-5.5 | 0.4-1 |
| Power (Watts) | 0-500 | 50-200 |
| Process Temperature (° C.) | 300-950 | 400-900 |
| Deposition Time (sec) | 30-1800 | 180-600 |

Following formation of CNT material 202, dielectric material 238 is deposited on top of and around CNT material 202 to substantially fill the remaining area around CNT material 202 in openings or voids 250. A CMP or dielectric etchback step then is performed to planarize dielectric material 238 and remove the dielectric material to expose the top of CNT material 202. Following planarization of dielectric material 238, second conductor 208 is formed, such as described above in connection with FIG. 3A.

In example embodiments of the invention, electrochemical decoration ("ECD") of exposed tips of CNT material 202 may be used to improve contact between CNT material 202 and second conductor 208 prior to formation of second conductor 208. For example, researchers at IMEC have demonstrated ECD of copper or nickel onto CNTs, which can then be used as a metal cap. See, e.g., http://www.imec.be/ScientificReport/SR2009/HTML/1213427.html.

As an alternative to using such a metal cap on CNT material 202, cleaning procedures may be used following CMP to improve the connection between CNT material 202 and second conductor 208. For example, plasma sputter etching with argon or $N_2$, or a dilute wet clean with hydrofluoric or sulfuric acid may be used.

For advanced scaling nodes having very high aspect ratios (e.g., in which the ratio of the height/width of openings or voids 250 is much greater than about 10), diffusion limitations may inhibit reliable CNT growth in openings or voids 250. For such scaling nodes, alternative CNT seeding options may be used.

Figure 3D:
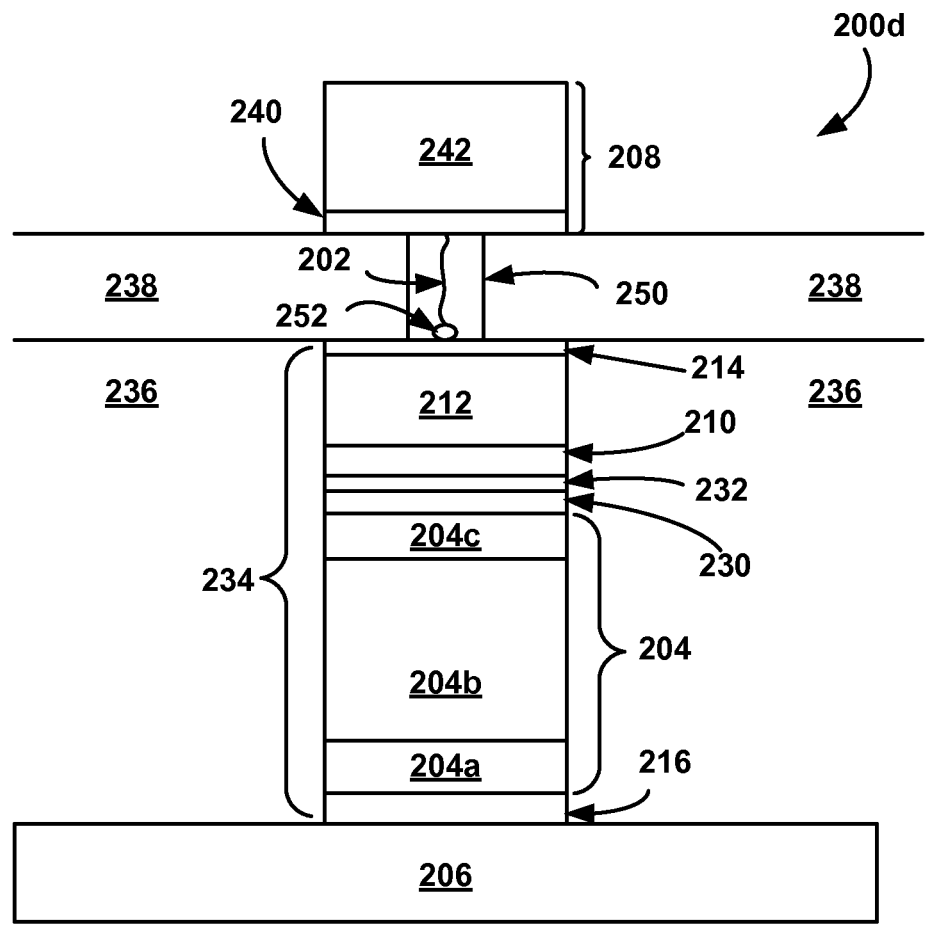
FIG. 3D is a cross-sectional view of a fourth example embodiment of the memory cell of FIG. 2A.

For example, FIG. 3D is a cross-sectional view of a fourth example embodiment of a memory cell 200d in accordance with this invention, in which a CNT seed particle 252 is selectively deposited in opening or void 250, and CNT material 202 is grown on CNT seed particle 252. Although CNT seed particle 252 is depicted in FIG. 3D as spherical in shape, persons of ordinary skill in the art will understand that CNT seed particles 252 in accordance with this invention may have other shapes.

Example CNT seed particles 252 may include cobalt, titanium, iron, molybdenum, nickel, or other similar metals, organo-metallic precursors derived from cobalt, titanium, iron, molybdenum, nickel, or other similar metals (e.g., ferrocene from iron, etc.), ferritin particles with between about 5-400 atoms of Fe, iron acetate (($C_2H_3O_2)_2Fe$) dissolved in ethanol/ethylene glycol or other organic solution, or other similar seed particle or catalyst materials.

CNT seed particle 252 may be selectively deposited in openings or voids 250 by any suitable method. For example, organo-metallic precursors derived from cobalt, titanium, iron, molybdenum, nickel, or other similar metals may be dissolved in a solvent such as ethanol, and the solution may be used to coat the substrate by dip-coating, spin-coating, or other similar method. Other similar techniques may be used.

For example, Do-Yoon Kim et al., "Selective Deposition of Catalyst Nanoparticles Using the Gravitational Force for Carbon nanotubes Interconnect," Thin Film Solids, 516:3534-3537 (2008) describes a technique for depositing catalyst at the bottom of vias by (1) forming a catalyst solution by dissolving iron acetate in ethanol and ethylene glycol, (2) spin-coating the solution on a sample including a large number of vias, (3) placing the sample on a horizontal plane to allow the catalyst to be pulled down into the vias by gravity, and (4) selectively removing catalyst layer not pulled into the bottom of the holes by treating the surface with tetramethylammonium hydroxide ("TMAH").

Although example memory cell 200d is shown including CNT seed particle 252 formed on CNT seeding layer 214, persons of ordinary skill in the art will understand that CNT seeding layer 214 optionally may be omitted, and CNT seed particle 252 may be formed on conductive layer 212.

Following selective deposition of CNT seed particle 252 in openings or voids 250, a CNT fabrication process is performed to selectively grow and/or deposit CNT material 202 on CNT seed particle 252. By virtue of the narrow width of openings or voids 250, CNT material 202 preferably includes a single CNT.

Any suitable method may be used to form CNT material 202 on CNT seed particle 252. For example, CVD, PECVD, laser vaporization, electric arc discharge or the like may be employed. In one example embodiment, a single CNT may be formed on a nickel catalyst CNT seed particle 252 by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, a single CNT may be formed on a metal catalyst CNT seed particle 252 such as nickel, cobalt, iron, titanium, molybdenum, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

In addition, the example process parameter ranges specified in Table 1, above may be used to form CNT material 202 on CNT seed particle 252.

Following formation of CNT material 202, dielectric material 238 is deposited on top of and around CNT material 202 to substantially fill the remaining area around CNT material 202 in openings or voids 250. A CMP or dielectric etchback step then is performed to planarize dielectric material 238 and remove the dielectric material from the top of CNT material 202. As described above in connection with FIG. 3C, following planarization of dielectric material 238, second conductor 208 is formed. As also described above in connection with FIG. 3C, ECD or cleaning procedures may be used following CMP to improve the connection between CNT material 202 and second conductor 208.

As described above, in some embodiments of this invention, memory cells may include a CNT diode instead of a semiconductor diode. Researchers have demonstrated that CNT diodes have demonstrated rectification performance within a tolerance limit of a memory array, and compatible with a CNT switching element (referred to in the remaining description as a "CNT switch").

Figure 3E:
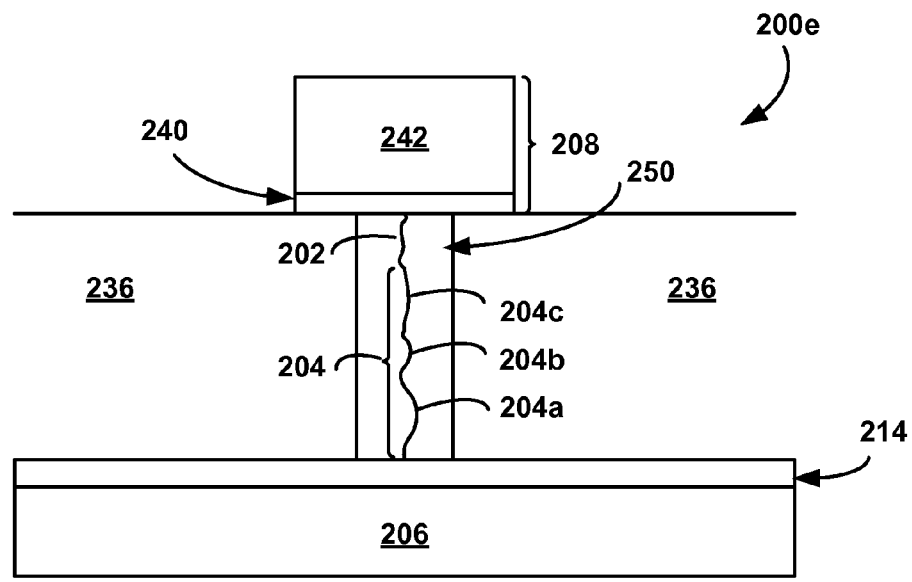
FIG. 3E is a cross-sectional view of a fifth example embodiment of the memory cell of FIG. 2A.

Thus, some example embodiments of this invention include a memory cell that has a single CNT that includes a CNT diode coupled to a CNT switch. In particular, FIG. 3E is a cross-sectional view of a fifth example embodiment of a memory cell 200e in accordance with this invention that includes a single CNT that includes a first portion 202 that operates as reversible resistance-switching element (referred to in the remaining discussion as "CNT switch 202"), and a second portion that operates as a p-n or a p-i-n diode (referred to in the remaining discussion as "CNT diode 204"). Although not wanting to be bound by any particular theory, it is believed that forming a single CNT that includes both a switching portion and a diode portion may simplify process flow, and may reduce processing costs.

In the embodiment of FIG. 3E, a CNT seeding layer 214 is formed over first conductor 206. CNT seeding layer 214 may be a single layer of roughened metal nitride, such as surface-roughened titanium nitride or tantalum nitride, or may be a single layer of a metal catalyst such as nickel, cobalt, iron, titanium, molybdenum, etc. CNT seeding layer 214 and first conductor 206 may be patterned and etched together during formation of first conductor 206.

CNT seeding layer 214 may be about 1000 to about 5000 angstroms of a metal nitride, such as titanium nitride or tantalum nitride, with an arithmetic average surface roughness Ra of about 850 to about 4000 angstroms, and more preferably about 4000 angstroms.

Alternatively, CNT seeding layer 214 may include about 1 to about 200 angstroms, and more preferably about 20 angstroms or less, of a metal catalyst layer such as nickel, cobalt, iron, titanium, molybdenum, etc. The nickel, cobalt, iron, titanium, molybdenum or other metal catalyst layer may be a continuous or non-continuous film. Other materials, thicknesses and surface roughness conditions may be used.

Dielectric material 236 is then formed on CNT seeding layer 214. For example, dielectric material 236 may be between about 100 angstroms and about 5000 angstroms, more generally between about 10 angstroms and about 2 microns of silicon dioxide, silicon nitride, silicon oxynitride, or other similar insulating material. Dielectric material 236 may be formed by CVD, high density plasma, or other similar method. Other thickness values may be used.

Dielectric material 236 may then be patterned and etched to create openings or voids 250 that extend to CNT seeding layer 214, such as described above in connection with FIGS. 3C-3D. Openings or voids 250 are substantially aligned with first conductors 206 and second conductors 208. As described above, various patterning techniques may be used to form openings or voids 250 in dielectric material 236. For example, imprint lithography, immersion lithography, EUV lithography, or other similar lithography techniques may be used to form openings or voids 250 having features (e.g., widths and lengths) less than about 10 nanometers.

Following formation of openings or voids 250, a CNT fabrication process is performed to selectively grow and/or deposit CNT switch 202 and CNT diode 204 on CNT seeding layer 214. By virtue of the narrow width of openings or voids 250, CNT switch 202 and CNT diode 204 each preferably includes a single CNT.

CNT switch 202 and CNT diode 204 may be formed by CVD, PECVD, laser vaporization, electric arc discharge or the like may be employed, such as described above in connection with FIGS. 3C-3D. CNT switch 202 may be formed above CNT diode 204, or vice-versa. For example, as shown in FIG. 3E, CNT diode 204 may be formed on CNT seeding layer 214, and CNT switch 202 may be formed above CNT diode 204. Persons of ordinary skill in the art will understand that CNT switch 202 may be formed on CNT seeding layer 214, and CNT diode 204 may be formed above CNT switch 202.

CNT diode 204 may be a p-n or p-i-n diode, whether upward pointing or downward pointing. As shown in FIG. 3E, CNT diode 204 may be a downward pointing diode that includes a heavily doped n+CNT region 204a, a lightly doped or intrinsic (unintentionally doped) CNT region 204b above n+CNT region 204a, and a heavily doped p+CNT region 204c above intrinsic CNT region 204b.

Any suitable method may be used to form CNT switch 202 and CNT diode 204 on CNT seeding layer 214. For example, CVD, PECVD, laser vaporization, electric arc discharge or the like may be employed, such as described above in connection with FIG. 3C. In particular, the example process parameters of Table 1, above may be used to form CNT switch 202. To form CNT diode 204, N and P sections (such as heavily doped n+ CNT region 204a and heavily doped p+ CNT region 204c, respectively) are required. For example, during formation of CNT diode 204 by CVD, heavily doped n+CNT region 204a and heavily doped p+ CNT region 204c may be formed by sequentially injecting or pulsing N or P doping precursors into the CVD chamber during CNT growth.

For instance, heavily doped n+CNT region 204a may be created by in-situ doping with nitrogen, such as described in Kai Xiao et al., "n-Type Field-Effect Transistors Made of an Individual Nitrogen-Doped Multiwalled Carbon Nanotube," J. A. Chem. Soc., 127:8614-8617 (2005), which is incorporated by reference herein in its entirety for all purposes. Lightly doped or intrinsic CNT region 204b may be formed by continuing CNT growth but without nitrogen doping. Heavily doped p+ CNT region 204c may be formed by in-situ injection of a halogen element (e.g., bromine, iodine, etc.), such as described in Park et al. U.S. Pat. No. 7,501,650 for "P-TYPE SEMICONDUCTOR CARBON NANOTUBE USING HALOGEN ELEMENT AND FULLERENE OR ALKALI ELEMENT," or by in-situ doping using a boron precursor during CNT growth, such as described in Kartick C. Mondal et al., "Physical Properties of CVD Boron-Doped Multiwalled Carbon Nanotubes," Mat. Ch. & Phys., Vol. 111, Issues 2-3, pp. 386-390 (Oct. 15, 2008), each of which is incorporated by reference herein in its entirety for all purposes.

In addition to these examples, Tables 2-4, below, illustrate example process ranges for forming heavily doped n+ CNT region 204a, intrinsic region 204b and heavily doped p+ CNT region 204c, respectively, by CVD.

TABLE 2

Example CVD Process Parameters for forming
heavily doped n+ CNT region 204a

| PROCESS PARAMETER | EXAMPLE RANGE | PREFERRED RANGE |
|---|---|---|
| Argon Flow Rate (sccm) | 0-400 | 2-60 |
| Hydrocarbon ($C_2H_4$ and or $CH_4$) Flow Rate (sccm) | 0.01-600 | 5-100 |
| $N_2$ and or $NH_3$ Flow Rate (sccm) | 0.01-400 | 0.5-100 |
| $H_2$ Flow Rate (sccm) | 0-400 | 10-200 |
| Pressure (Torr) | 0.1-5.5 | 0.4-1 |
| Power (Watts) | 0-500 | 50-200 |
| Process Temperature (° C.) | 500-950 | 600-900 |
| Deposition Time (sec) | 0.1-500 | 0.1-180 |

TABLE 3

Example CVD Process Parameters for
forming intrinsic CNT region 204b

| PROCESS PARAMETER | EXAMPLE RANGE | PREFERRED RANGE |
|---|---|---|
| Argon Flow Rate (sccm) | 0-400 | 2-60 |
| Hydrocarbon ($C_2H_4$ and or $CH_4$) Flow Rate (sccm) | 0.01-1500 | 10-1000 |
| $H_2$ Flow Rate (sccm) | 0-800 | 0-500 |
| Pressure (Torr) | 0.1-5.5 | 0.4-1 |
| Power (Watts) | 0-500 | 50-200 |
| Process Temperature (° C.) | 500-950 | 600-900 |
| Deposition Time (sec) | 30-1800 | 180-600 |

TABLE 4

Example CVD Process Parameters for forming
heavily doped p+ CNT region 204c

| PROCESS PARAMETER | EXAMPLE RANGE | PREFERRED RANGE |
|---|---|---|
| Argon Flow Rate (sccm) | 0-400 | 2-60 |
| Hydrocarbon ($C_2H_4$ and or $CH_4$) Flow Rate (sccm) | 0.01-600 | 5-100 |
| $BF_3$ Flow Rate (sccm) | 0.01-400 | 0.5-50 |
| $H_2$ Flow Rate (sccm) | 0-400 | 0-200 |
| Pressure (Torr) | 0.1-5.5 | 0.4-1 |
| Power (Watts) | 0-500 | 50-200 |
| Process Temperature (° C.) | 500-950 | 600-900 |
| Deposition Time (sec) | 0.1-500 | 0.1-180 |

Following formation of CNT diode 204 and CNT switch 202, dielectric material 236 is deposited on top of and around CNT diode 204 and CNT switch 202 to substantially fill the remaining area around CNT diode 204 and CNT switch 202 in openings or voids 250. A CMP or dielectric etchback step then is performed to planarize dielectric material 236 and remove the dielectric material from the top of CNT switch 202. As described above in connection with FIG. 3C, following planarization of dielectric material 236, second conductor 208 is formed. As also described above in connection with FIG. 3C, ECD or cleaning procedures may be used following CMP to improve the connection between CNT switch 202 and second conductor 208.

In single carbon nanotube switching, switching with low current preferably occurs in a CNT with a local defect. Without wanting to be bound by any particular theory, it is believed that localized heating is needed to break and/or physically modify the CNT at the defect point (RESET), and then mend the CNT with high electric field (SET). The switching location along the CNT should be limited to a non-diode section of the CNT (e.g., switching should occur in CNT switch 202, not CNT diode 204).

In accordance with example embodiments of this invention, to create a predetermined switch location on CNT switch 202, a high resistance location in the CNT may be made by intentionally introducing defects into the CNT. Preferably, defects may be introduced by modifying the in-situ growth conditions to reduce crystallinity and introduce defects in a controlled way.

For example, Franz Kreupl et al., "Carbon nanotubes for Interconnect Applications," Electron Devices Meeting, 2004, IEDM Tech. Digest, pp. 683-686 (December 2004), which is incorporated by reference herein in its entirety for all purposes, indicates that interrupting CNT growth introduces defects at the interface of "interrupted growth."

An alternative method of creating intentional defects during CNT growth is to implant, such as with argon, nitrogen, oxygen or other similar implant species. Without wanting to be bound by any particular theory, it is believed that implantation increases resistance in the CNT. If the implant is to be implemented, a light implant post CMP can be used, or a deeper implant through second conductor 208 to the CNT/metal interface can also be done.

Alternatively, controlling CNT defects at second conductor 208 also might be used. Without wanting to be bound by any particular theory, it is believed that second conductor 208 quality is also directly linked to the number of CNT shells contacted as well as the etch back or CMP on second conductor 208. Annealing in a reducing gas before subsequent gap fill and CMP may help insure that first conductor 206 has lower resistance than second conductor 208. In each of the above-described techniques, the resistance of the CNT increases with increasing number of defects introduced in the CNT.

In the embodiment of FIG. 3E, single CNT switch 202 and CNT diode 204 are formed on CNT seeding layer 214 in openings or voids 250. Alternatively, single CNT switch 202 and CNT diode 204 may be formed in openings or voids 250 CNT using seed particle 252, without the need for a CNT seeding layer 214. In particular, FIG. 3F is a cross-sectional view of a sixth example embodiment of memory cell 200f in accordance with this invention that includes a single CNT switch 202 and CNT diode 204 formed on CNT seed particle 252.

Figure 3F:
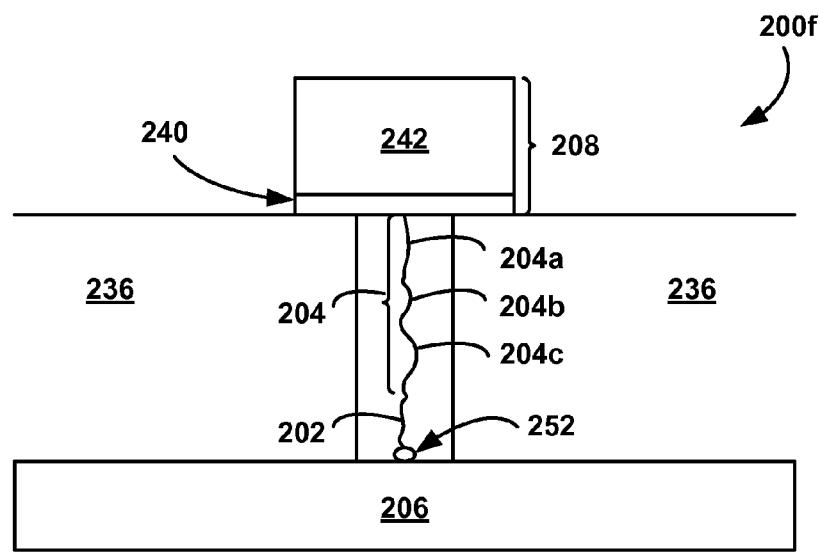
FIG. 3F is a cross-sectional view of a sixth example embodiment of the memory cell of FIG. 2A.

In the embodiment of FIG. 3F, dielectric material 236 is formed on first conductor 206. For example, dielectric material 236 may be between about 100 angstroms and about 5000 angstroms, more generally between about 10 angstroms and about 2 microns of silicon dioxide, silicon nitride, silicon oxynitride, or other similar insulating material. Dielectric material 236 may be formed by CVD, high density plasma, or other similar method. Other thickness values may be used.

Dielectric material 236 may then be patterned and etched to create openings or voids 250 that extend to first conductor 206, such as described above in connection with FIGS. 3C-3D. As described above, various patterning techniques may be used to form openings or voids 250 in dielectric material 236. For example, imprint lithography, immersion lithography, EUV lithography, or other similar lithography techniques may be used to form openings or voids 250 having features (e.g., widths and lengths) less than about 10 nanometers.

Following formation of openings or voids 250, a CNT seed particle 252 is formed in each opening or void. In one example embodiment, CNT seed particle 252 is selectively deposited in each opening or void 250, and a single CNT including CNT switch 202 and CNT diode 204 is grown on CNT seed particle 252. Although CNT seed particle 252 is depicted in FIG. 3F as spherical in shape, persons of ordinary skill in the art will understand that CNT seed particles 252 in accordance with this invention may have other shapes.

Example CNT seed particles 252 may include cobalt, titanium, iron, molybdenum, nickel, or other similar metals, organo-metallic precursors derived from cobalt, titanium, iron, molybdenum, nickel, or other similar metals (e.g., ferrocene from iron, etc.), ferritin particles with between about 5-400 atoms of Fe, iron acetate (($C_2H_3O_2$)$_2$Fe) dissolved in ethanol/ethylene glycol or other organic solution, or other similar CNT seed particle or catalyst materials.

CNT seed particles 252 may be selectively deposited in openings or voids 250 by any suitable method, such as those described above in connection with FIG. 3D. Following selective deposition of CNT seed particles 252 in openings or voids 250, a CNT fabrication process is performed to selectively grow and/or deposit CNT switch 202 and CNT diode 204 on CNT seed particle 252. By virtue of the narrow width of openings or voids 250, CNT switch 202 and CNT diode 204 preferably include a single CNT.

Any suitable method may be used to form CNT switch 202 and CNT diode 204 on CNT seed particle 252, such as the techniques described above in connection with FIG. 3D. To form CNT diode 204, N and P sections (such as heavily doped n+ CNT region 204a and heavily doped p+ CNT region 204c, respectively) are formed, such as using the techniques described above in connection with FIG. 3E.

CNT diode 204 may be formed above CNT switch 202, or vice-versa. For example, as shown in FIG. 3F, CNT switch 202 may be formed on CNT seed particle 252, and CNT diode 204 may be formed above CNT switch 202. Persons of ordinary skill in the art will understand that CNT diode 204 may be formed on CNT seed particle 252, and CNT switch 202 may be formed above CNT diode 204.

CNT diode 204 may be a p-n or p-i-n diode, whether upward pointing or downward pointing. As shown in FIG. 3F, CNT diode 204 may be an upward pointing diode that includes a heavily doped p+CNT region 204c, a lightly doped or intrinsic (unintentionally doped) CNT region 204b above p+CNT region 204c, and a heavily doped n+CNT region 204a above intrinsic CNT region 204b.

Following formation of CNT switch 202 and CNT diode 204, dielectric material 236 is deposited on top of and around CNT switch 202 and CNT diode 204 to substantially fill the remaining area around CNT switch 202 and CNT diode 204 in openings or voids 250. A CMP or dielectric etchback step then is performed to planarize dielectric material 236 and remove the dielectric material from the top of CNT diode 204. In cases where the width of the CNT completely fills the trench, a dielectric fill in the remaining area around the CNT may be unnecessary. A CMP may or may not be needed to reduce the CNT protruding from the trench after the growth is finished.

As described above in connection with FIG. 3C, following planarization of dielectric material 236, second conductor 208 is formed. As also described above in connection with FIG. 3C, ECD or cleaning procedures may be used following CMP to improve the connection between CNT diode 204 and second conductor 208. As described above in connection with FIG. 3E, defects may intentionally be introduced in the CNT to create a predetermined switch location on CNT switch 202.

As an alternative to selective formation of CNT seed particles 252 in openings or voids 250, CNT seed particles 252 may be non-selectively deposited. In particular, after dielectric material 236 is formed on first conductor 206, and then patterned and etched to create openings or voids 250 that extend to first conductor 206, numerous CNT seed particles 252 may be non-selectively sputter deposited on dielectric material 236. Some CNT seed particles 252 will form inside openings or voids 250, and some CNT seed particles 252 will form on an upper surface of dielectric material 236.

Following non-selective deposition of CNT seed particles 252, a CNT fabrication process is performed to grow and/or deposit CNT switch 202 and CNT diode 204 on CNT seed particles 252. By virtue of the narrow width of openings or voids 250, CNT switch 202 and CNT diode 204 preferably includes a single CNT in openings or voids 250. Any suitable method may be used to form CNT switch 202 and CNT diode 204 on CNT seed particles 252, such as the techniques described above in connection with FIG. 3D. Because CNT seed particles 252 were non-selectively formed on dielectric material 236, CNT switches 202 and CNT diodes 204 will form not only in openings or voids 250, but also on the upper surface of dielectric material 236.

Following formation of CNT switches 202 and CNT diodes 204, additional dielectric material 236 is deposited on top dielectric material 236 to substantially fill the remaining area around CNT switch 202 and CNT diode 204 in openings or voids 250. A CMP or dielectric etchback step then is performed to planarize dielectric material 236 and remove the CNT switches 202 and CNT diodes 204 that formed on the upper surface of dielectric material 236. As described above in connection with FIG. 3C, following planarization of dielectric material 236, second conductor 208 is formed.

Example Fabrication Process for a Memory Cell

FIGS. 4A-4D illustrate cross sectional views of a portion of a substrate 260 during fabrication of a first memory level in accordance with the present invention. As will be described below, the first memory level includes a plurality of memory cells that each include a reversible resistance-switching element formed by selectively fabricating CNT material above a substrate. Additional memory levels may be fabricated above the first memory level (as described previously with reference to FIGS. 2C-2D).

Figure 4A:
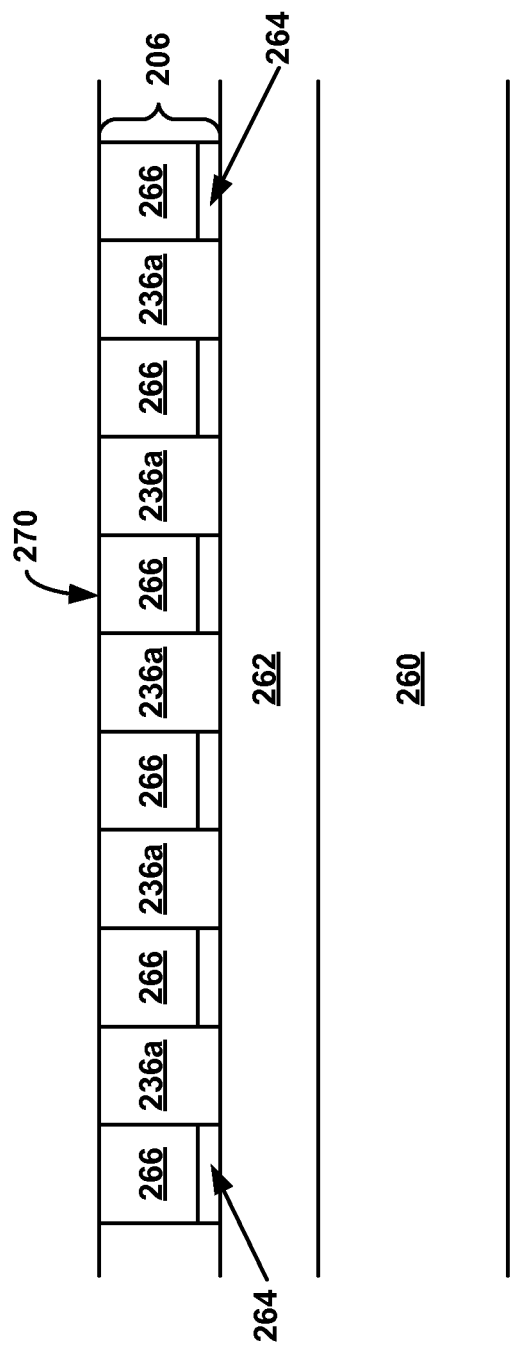
FIGS. 4A-4D illustrate cross sectional views of a portion of a substrate during fabrication of a single memory level in accordance with the present invention.

With reference to FIG. 4A, substrate 260 is shown as having already undergone several processing steps. Substrate 260 may be any suitable substrate such as a silicon, germanium, silicon-germanium, undoped, doped, bulk, silicon-on-insulator ("SOI") or other substrate with or without additional circuitry. For example, substrate 260 may include one or more n-well or p-well regions (not shown).

Isolation layer 262 is formed above substrate 260. In some embodiments, isolation layer 262 may be a layer of silicon dioxide, silicon nitride, silicon oxynitride or any other suitable insulating layer.

Following formation of isolation layer 262, an adhesion layer 264 is formed over isolation layer 262 (e.g., by physical vapor deposition ("PVD") or another method). For example, adhesion layer 264 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 264 may be optional.

After formation of adhesion layer 264, a conductive layer 266 is deposited over adhesion layer 264. Conductive layer 266 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 266 may comprise about 200 to about 2500 angstroms of tungsten. Other conductive layer materials and/or thicknesses may be used.

Following formation of conductive layer 266, adhesion layer 264 and conductive layer 266 are patterned and etched. For example, adhesion layer 264 and conductive layer 266 may be patterned and etched using conventional lithography techniques, with a soft or hard mask, and wet or dry etch processing.

In at least one embodiment, adhesion layer 264 and conductive layer 266 are patterned and etched to form substantially parallel, substantially co-planar first conductors 206 (as shown in FIG. 4A). Example widths for first conductors 206 and/or spacings between first conductors 206 range from about 200 to about 2500 angstroms, although other conductor widths and/or spacings may be used.

After first conductors 206 have been formed, a dielectric layer 236a is formed over substrate 260 to fill the voids between first conductors 206. For example, approximately 3000-7000 angstroms of silicon dioxide may be deposited on substrate 260 and planarized using CMP or an etchback process to form a planar surface 270.

Planar surface 270 includes exposed top surfaces of first conductors 206 separated by dielectric material 236a (as shown). Other dielectric materials such as silicon nitride, silicon oxynitride, low K dielectrics, etc., and/or other dielectric layer thicknesses may be used. Example low K dielectrics include carbon doped oxides, silicon carbon layers, or the like.

In other embodiments of the invention, first conductors 206 may be formed using a damascene process in which dielectric layer 236a is formed, patterned and etched to create openings or voids for first conductors 206. The openings or voids then may be filled with adhesion layer 264 and conductive layer 266 (and/or a conductive seed, conductive fill and/or barrier layer if needed). Adhesion layer 264 and conductive layer 266 then may be planarized to form planar surface 270. In such an embodiment, adhesion layer 264 will line the bottom and sidewalls of each opening or void.

Figure 4B:
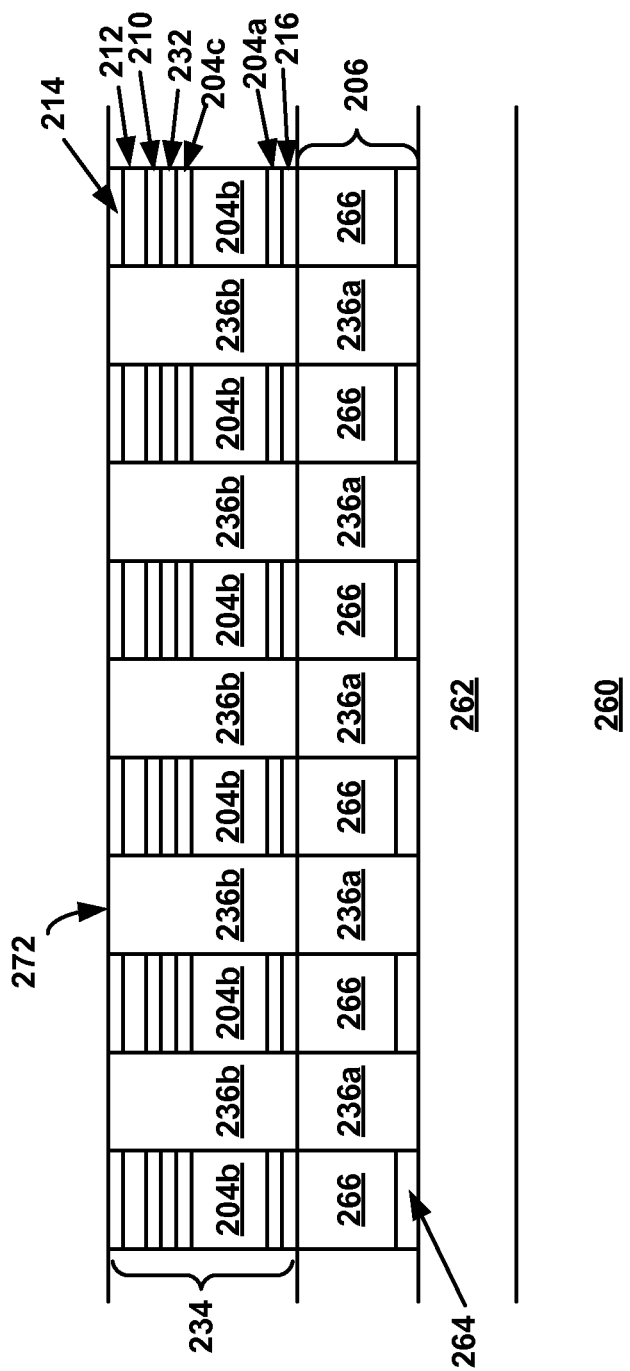
Figure 4C:
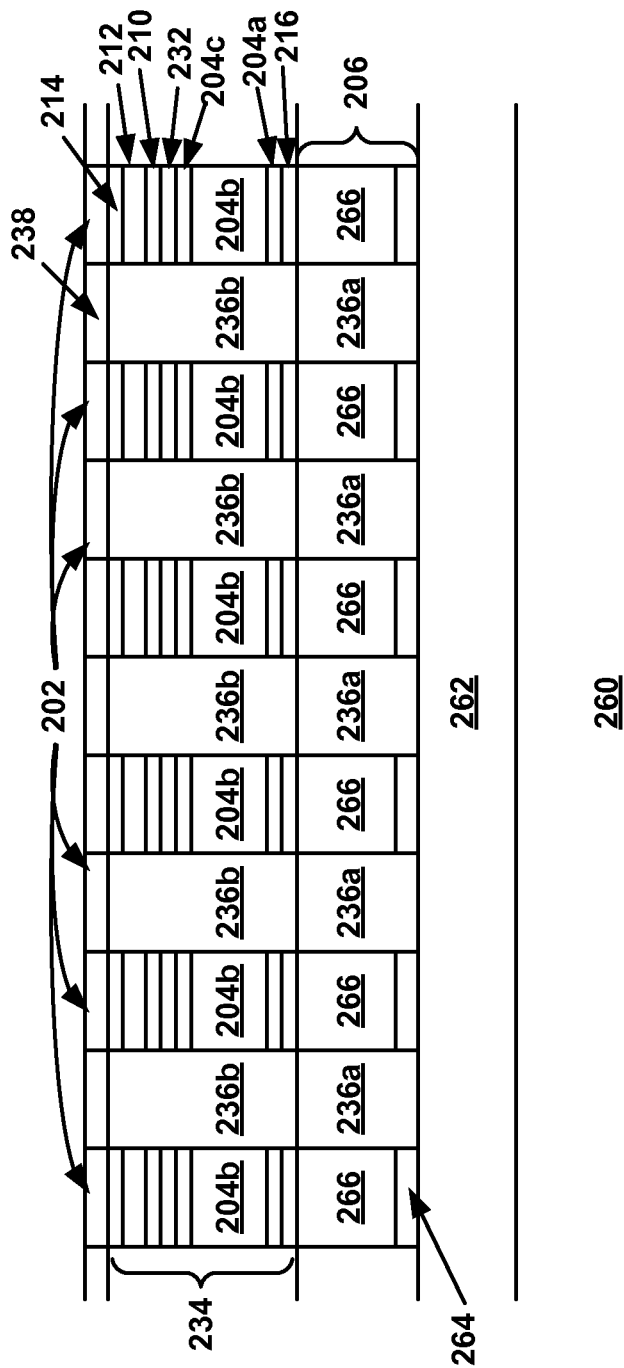

Following planarization, the diode structures of each memory cell are formed. With reference to FIG. 4B, a barrier layer 216 is formed over the planarized top surface 270 of substrate 260. Barrier layer 216 may be about 20 to about 500 angstroms, and preferably about 100 angstroms, of titanium or another suitable barrier layer such as titanium nitride, tantalum, tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 216, deposition of the semiconductor material used to form the diode of each memory cell begins (e.g., diode 204 in FIGS. 2A-3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 216, a heavily doped n+ silicon layer 204a is deposited on barrier layer 216. In some embodiments, n+ silicon layer 204a is in an amorphous state as deposited. In other embodiments, n+ silicon layer 204a is in a polycrystalline state as deposited. CVD or another suitable process may be employed to deposit n+ silicon layer 204a.

In at least one embodiment, n+ silicon layer 204a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. n+ silicon layer 204a may be doped in situ, for example, by flowing a donor gas during deposition. Other doping methods may be used (e.g., implantation).

After deposition of n+ silicon layer 204a, a lightly doped, intrinsic and/or unintentionally doped silicon layer 204b is formed over n+ silicon layer 204a. In some embodiments, intrinsic silicon layer 204b is in an amorphous state as deposited. In other embodiments, intrinsic silicon layer 204b is in a polycrystalline state as deposited.

CVD or another suitable deposition method may be employed to deposit intrinsic silicon layer 204b. In at least one embodiment, intrinsic silicon layer 204b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 204a prior to deposition of intrinsic silicon layer 204b to prevent and/or reduce dopant migration from n+ silicon layer 204a into intrinsic silicon layer 204b (as described in the '331 Application, previously incorporated).

Heavily doped, p-type silicon is either deposited and doped by ion implantation or is doped in situ during deposition to form a p+ silicon layer 204c. For example, a blanket p+ implant may be employed to implant boron a predetermined depth within intrinsic silicon layer 204b. Example implantable molecular ions include $BF_2$, $BF_3$, B and the like.

In some embodiments, an implant dose of about $1-5 \times 10^{15}$ ions/cm$^2$ may be employed. Other implant species and/or doses may be used. Further, in some embodiments, a diffusion process may be employed. In at least one embodiment, the resultant p+ silicon layer 204c has a thickness of about 100-700 angstroms, although other p+ silicon layer sizes may be used.

Following formation of p+ silicon layer 204c, a silicide-forming metal layer 232 is deposited over p+ silicon layer 204c. Example silicide-forming metals include sputter or otherwise deposited titanium or cobalt. In some embodiments, silicide-forming metal layer 232 has a thickness of about 10 to about 200 angstroms, preferably about 20 to about 50 angstroms and more preferably about 20 angstroms. Other silicide-forming metal layer materials and/or thicknesses may be used.

A barrier layer 210 is deposited over silicide-forming metal layer 232. Barrier layer 210 may be about 20 to about 500 angstroms, and preferably about 100 angstroms, of titanium or another suitable barrier layer such as titanium nitride, tantalum, tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Following formation of barrier layer 210, a conductive layer 212 is formed over barrier layer 210. Conductive layer 212 may be about 50 to about 1000 angstroms, and preferably about 500 angstroms of conductive material such as tungsten or another suitable metal. Other thickness values may be used.

Following formation of conductive layer 212, a CNT seeding layer 214 is formed over conductive layer 212. In some embodiments, CNT seeding layer 214 may be about 1000 to about 5000 angstroms of titanium nitride or tantalum nitride, although other thicknesses may be used.

Barrier layer 216, silicon regions 204a, 204b, and 204c, silicide-forming metal layer 232, barrier layer 210, conductive layer 212 and CNT seeding layer 214 are then patterned and etched into pillars 234. For example, initially, CNT seeding layer 214, conductive layer 212 and barrier layer 210 are etched.

The etch continues, etching silicide-forming metal layer 232, silicon regions 204c, 204b, and 204a and barrier layer 216. CNT seeding layer 214, conductive layer 212 and barrier layer 216 serve as a hard mask during the silicon etch. A hard mask is an etched layer which serves to pattern the etch of an underlying layer; if all of the photoresist present on CNT seeding layer 214 has been consumed, the hard mask can provide the pattern in its stead.

In this manner, pillars 234 are formed in a single photolithographic step. Conventional lithography techniques, and wet or dry etch processing may be employed to form pillars 234. Each pillar 234 includes a p-i-n, downward-pointing diode 204. Upward-pointing p-i-n diodes may be similarly formed.

After pillars 234 have been formed, a dielectric layer 236b is deposited over pillars 234 to fill the voids between pillars 234. For example, approximately 200-7000 angstroms of silicon dioxide may be deposited and planarized using CMP or an etchback process to form a planar surface 272. Planar surface 272 includes exposed top surfaces of pillars 234 separated by dielectric material 236b (as shown). Other dielectric materials such as silicon nitride, silicon oxynitride, low K dielectrics, etc., and/or other dielectric layer thicknesses may be used. Example low K dielectrics include carbon doped oxides, silicon carbon layers, or the like.

After formation of planar surface 272, CNT material 202 (FIG. 4C) is selectively formed on CNT seeding layer 214 of each pillar 234. If CNT seeding layer 214 is titanium nitride, tantalum nitride or a similar material, the surface of CNT seeding layer 214 may be roughened to allow CNTs to be formed directly on CNT seeding layer 214.

For example, Smith et al., "Polishing TiN for Nanotube Synthesis," Proceedings of the 16$^{th}$ Annual Meeting of the Am. Soc. for Prec. Eng., Nov. 10-15, 2001, and Rao et al., "In situ-grown carbon nanotube array with excellent field emission characteristics," Applied Phy. Letters, 76:25, Jun. 19, 2000, pp. 3813-3815, describe techniques for forming CNTs on surface-roughened CNT seeding layers.

In one or more embodiments, CNT seeding layer 214 may be roughened to have an arithmetic average surface roughness Ra of at least about 850 to 4000 angstroms, and more preferably at least about 4000 angstroms. Other thickness values and/or surface roughness values may be employed.

In some embodiments, an additional metal catalyst/seeding layer (not shown) such as nickel, cobalt, iron, titanium, molybdenum, etc., may be selectively deposited over a surface-roughened CNT seeding layer 214 prior to formation of CNT material 202 to provide the benefits a metal catalyst during CNT formation (as described previously with reference to FIG. 3B). In other embodiments, a metal catalyst layer may be used without an underlying, surface-roughened seeding layer (as described previously with reference to FIG. 3A).

In either case, a CNT fabrication process is performed to selectively grow and/or deposit CNT material 202 on each pillar 234. Any suitable method may be used to form CNT material 202 on each pillar 234. For example, CVD, PECVD, laser vaporization, electric arc discharge or the like may be employed.

In one example embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another example embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, titanium, molybdenum, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 202 forms only over CNT seeding layer 214 of each pillar 234. In some embodiments, CNT material 202 may have a thickness of about 1 nanometers to about 1 micron (and even tens of microns), and more preferably about 10 to about 20 nanometers, although other CNT material thicknesses may be used. The density of individual tubes in CNT material 202 may be, for example, about $6.6 \times 10^3$ to about $1 \times 10^6$ CNTs/micron$^2$, and more preferably at least about $6.6 \times 10^4$ CNTs/micron$^2$, although other densities may be used.

For example, assuming pillars 234 have a width of about 45 nanometers, in some embodiments, it is preferred to have at least about 10 CNTs, and more preferably at least about 100 CNTs, in CNT material 202 formed on each pillar 234 (although fewer CNTs, such as 1, 2, 3, 4, 5, etc., or more CNTs, such as more than 100, may be employed).

Following formation of CNT material 202 on each pillar 234, dielectric material 238 is deposited on top of and around the regions of CNT material 202 to isolate adjacent CNT material regions from one another. A CMP or dielectric etchback step then is performed to planarize dielectric material 238 and remove the dielectric material from the top of the regions of CNT material 202.

For example, approximately 200-7000 angstroms, and in some embodiments a micron or more, of silicon dioxide may be deposited and planarized using CMP or an etchback process. Other dielectric materials such as silicon nitride, silicon oxynitride, low K dielectrics, etc., and/or other dielectric layer thicknesses may be used. Example low K dielectrics include carbon doped oxides, silicon carbon layers, or the like.

Figure 4D:
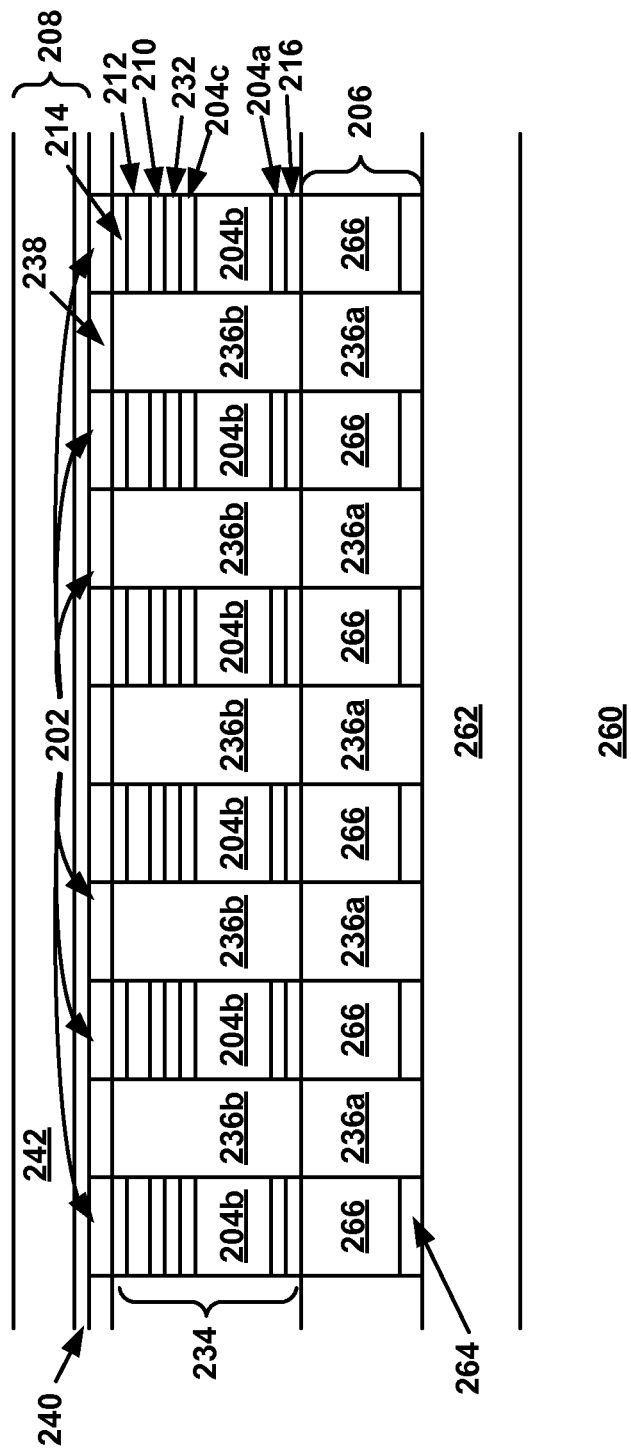

With reference to FIG. 4D, following planarization of dielectric material 238, second conductors 208 may be formed above pillars 234 in a manner similar to the formation of first conductors 206. For example, as shown in FIG. 4D, in some embodiments, one or more barrier layers and/or adhesion layers 240 may be deposited over CNT material 202 prior to deposition of a conductive layer 242 used to form second conductors 208.

Conductive layer 242 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used.

Barrier layers and/or adhesion layers 240 may include titanium or another suitable layer, such as titanium nitride, tantalum, tantalum nitride, tungsten, tungsten nitride, molybdenum, combinations of one or more layers, or any other suitable material(s). The deposited conductive layer 242 and barrier and/or adhesion layer 240, may be patterned and etched to form second conductors 208. In at least one embodiment, second conductors 208 are substantially parallel, substantially coplanar conductors that extend in a different direction than first conductors 206.

In other embodiments of the invention, second conductors 208 may be formed using a damascene process in which a dielectric layer is formed, patterned and etched to create openings or voids for second conductors 208. As described in the '936 Application, conductive layer 212 and barrier layer 210 may mitigate the effects of over-etching of such a dielectric layer during formation of the openings or voids for second conductors 208, preventing accidental shorting of diodes 204.

The openings or voids may be filled with adhesion layer 240 and conductive layer 242 (and/or a conductive seed, conductive fill and/or barrier layer if needed). Adhesion layer 240 and conductive layer 242 then may be planarized to form a planar surface.

Following formation of second conductors 208, the resultant structure may be annealed to crystallize the deposited semiconductor material of diodes 204 (and/or to form silicide regions by reaction of silicide-forming metal layer 232 with p+ region 204c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used.

The silicide regions formed as each silicide-forming metal layer region 232 and p+ region 204c react may serve as "crystallization templates" or "seeds" during annealing for underlying deposited semiconductor material that forms diodes 204 (e.g., changing any amorphous semiconductor material to polycrystalline semiconductor material and/or improving overall crystalline properties of diodes 204). Lower resistivity diode material thereby is provided.

Example Single CNT/Semiconductor Diode Memory Cell

FIGS. 5A-5D illustrate cross sectional views of a portion of a substrate 260 during fabrication of a first memory level in accordance with an alternative example embodiment of this invention. As will be described below, the first memory level includes a plurality of memory cells that each include a reversible resistance-switching element formed by selectively fabricating a single CNT above a substrate. Additional memory levels may be fabricated above the first memory level (as described previously with reference to FIGS. 2C-2D).

Figure 5A:
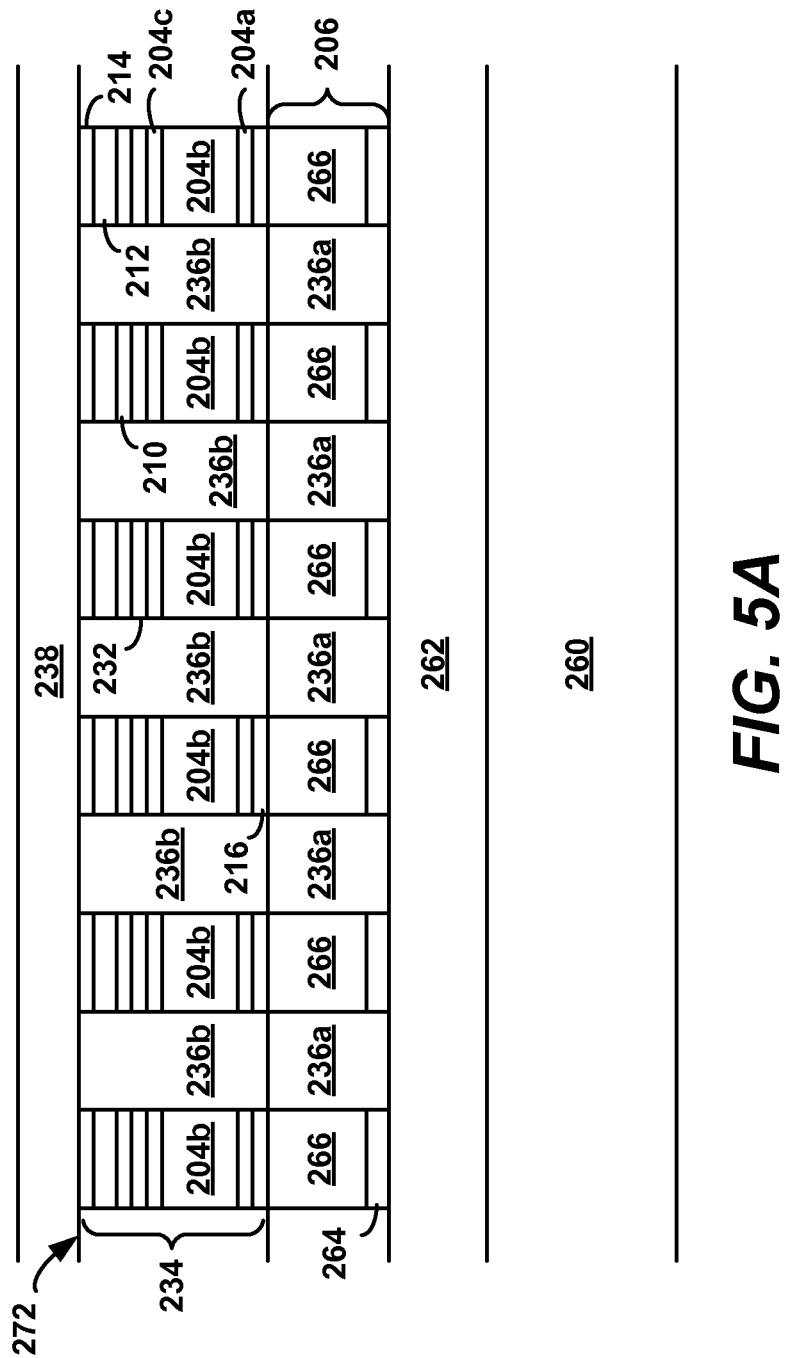
FIGS. 5A-5D illustrate cross sectional views of a portion of a substrate during an alternative example fabrication of a single memory level in accordance with the present invention.

With reference to FIG. 5A, substrate 260 is shown as having already undergone several processing steps, including formation of pillar structures 234 separated by dielectric material 236b, and planarization of dielectric material 236b using CMP or an etchback process to form a planar surface 272, as described above in connection with FIGS. 4A-4B. The CMP or etchback stops on CNT seeding layer 214, which may be titanium nitride, tantalum nitride or a similar material, and the surface of CNT seeding layer 214 may be roughened to allow CNTs to be formed directly on CNT seeding layer 214.

For example, as described above, in one or more embodiments, CNT seeding layer 214 may be roughened to have an arithmetic average surface roughness Ra of at least about 850 to 4000 angstroms, and more preferably at least about 4000 angstroms. Other thicknesses and/or surface roughness values may be employed.

In some embodiments, an additional metal catalyst/seeding layer (not shown) such as nickel, cobalt, iron, titanium, molybdenum, etc., may be selectively deposited over a surface-roughened CNT seeding layer 214 prior to formation of CNT material 202 to provide the benefits a metal catalyst during CNT formation (as described previously with reference to FIG. 3B). In other embodiments, a metal catalyst layer may be used without an underlying, surface-roughened seeding layer (as described previously with reference to FIG. 3A).

Next, dielectric layer 238 is deposited over planar surface 272, resulting in the structure shown in FIG. 5A. Dielectric material 238 may be between about 100 angstroms and about 2000 angstroms, more generally between about 10 angstroms and about 2 microns of silicon dioxide, silicon nitride, silicon oxynitride, or other similar insulating material. Other dielectric materials such as low K dielectrics, etc., and/or other dielectric layer thicknesses may be used. Example low K dielectrics include carbon doped oxides, silicon carbon layers, or the like. Dielectric material 238 may be formed by CVD, high density plasma, or other similar method.

Figure 5B:
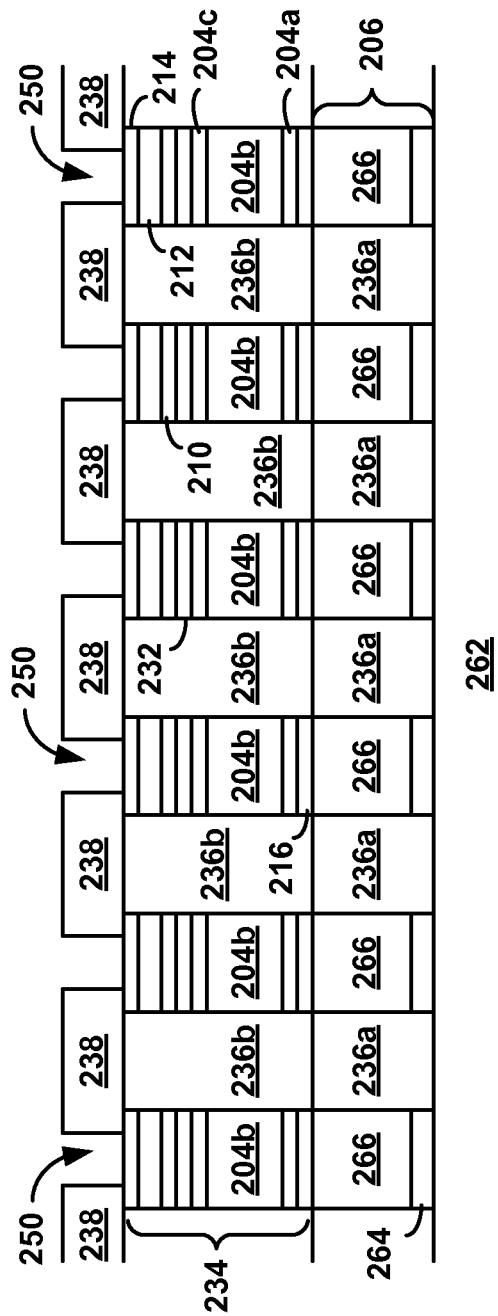

Dielectric material 238 may then be patterned and etched to create openings or voids 250, which are substantially aligned with pillar structures 234, as shown in FIG. 5B. For example, dielectric material 238 may be covered with a photoresist and exposed. Appropriate BARC, DARC and/or APF hard masks may be deposited on dielectric material 238 prior to patterning. The exposed (or unexposed) photoresist may be removed, and dielectric material 238 in the exposed (or unexposed) areas etched away to define openings or voids 250. The etch continues until CNT seeding layer 214 is exposed at the bottom of openings or voids 250.

Various patterning techniques may be used to form openings or voids 250 in dielectric material 238. For example, imprint lithography, immersion lithography, EUV lithography, or other similar lithography techniques may be used to form openings or voids 250 having features (e.g., widths and lengths) less than about 10 nanometers.

Figure 5C:
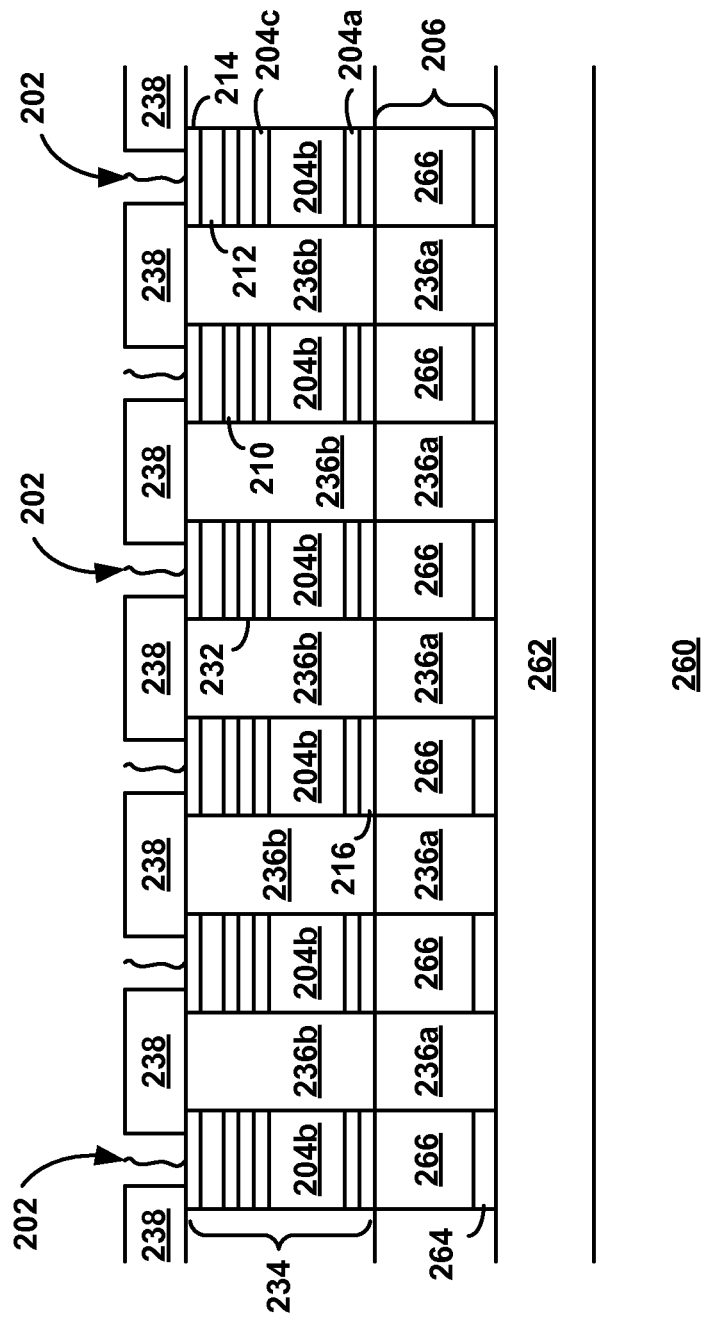
Figure 5D:
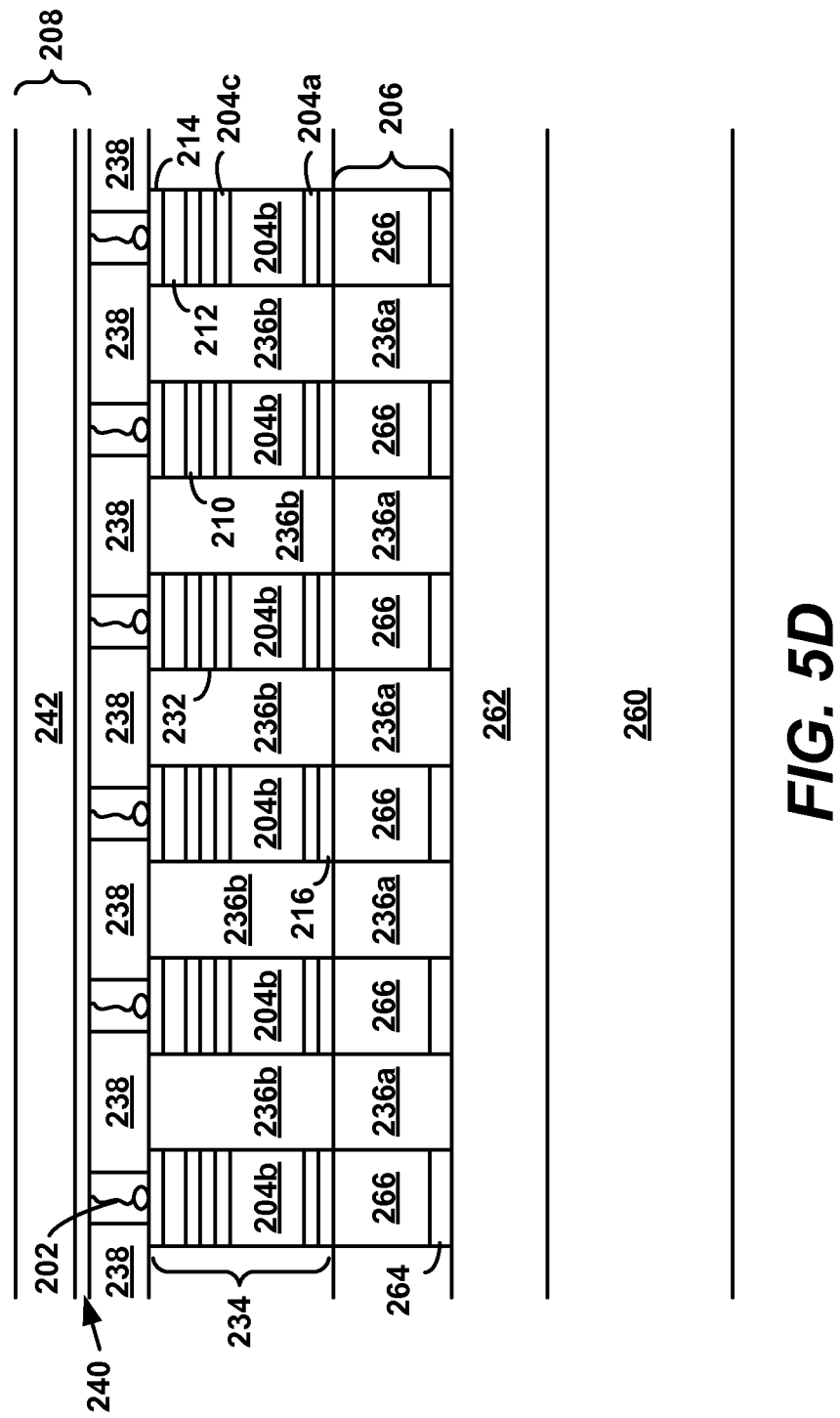

Following formation of openings or voids 250, a CNT fabrication process is performed to selectively grow and/or deposit CNT material 202 on CNT seeding layer 214. By virtue of the narrow width of openings or voids 250, CNT material 202 preferably includes a single CNT, such as shown in FIG. 5C.

Any suitable method may be used to form CNT material 202 on CNT seeding layer 214. For example, CVD, PECVD, laser vaporization, electric arc discharge or the like may be employed. In one example embodiment, a single CNT may be formed on a surface-roughened TiN CNT seeding layer 214 by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another example embodiment, a single CNT may be formed on a nickel catalyst CNT seeding layer 214 by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, a single CNT may be formed on a metal catalyst CNT seeding layer 214 such as nickel, cobalt, iron, titanium, molybdenum, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

In addition, the example process parameter ranges specified in Table 1, above may be used to form CNT material 202 on CNT seeding layer 214.

Following formation of CNT material 202, dielectric material 238 is deposited on top of and around CNT material 202 to substantially fill the remaining area around CNT material 202 in openings or voids 250. A CMP or dielectric etchback step then is performed to planarize dielectric material 238 and remove the dielectric material from the top of CNT material 202. As described above in connection with FIG. 3C, following planarization of dielectric material 238, second conductor 208 is formed. As also described above in connection with FIG. 3C, ECD or cleaning procedures may be used following CMP to improve the connection between CNT material 202 and second conductor 208.

Example Single CNT/CNT Diode Memory Cell

FIGS. 6A-6D illustrate cross sectional views of a portion of a substrate 260 during fabrication of a first memory level in accordance with another alternative example embodiment of this invention. As will be described below, the first memory level includes a plurality of memory cells that each include a selectively fabricated single CNT that includes a CNT switch and a CNT diode above a substrate. Additional memory levels may be fabricated above the first memory level (as described previously with reference to FIGS. 2C-2D).

Figure 6A:
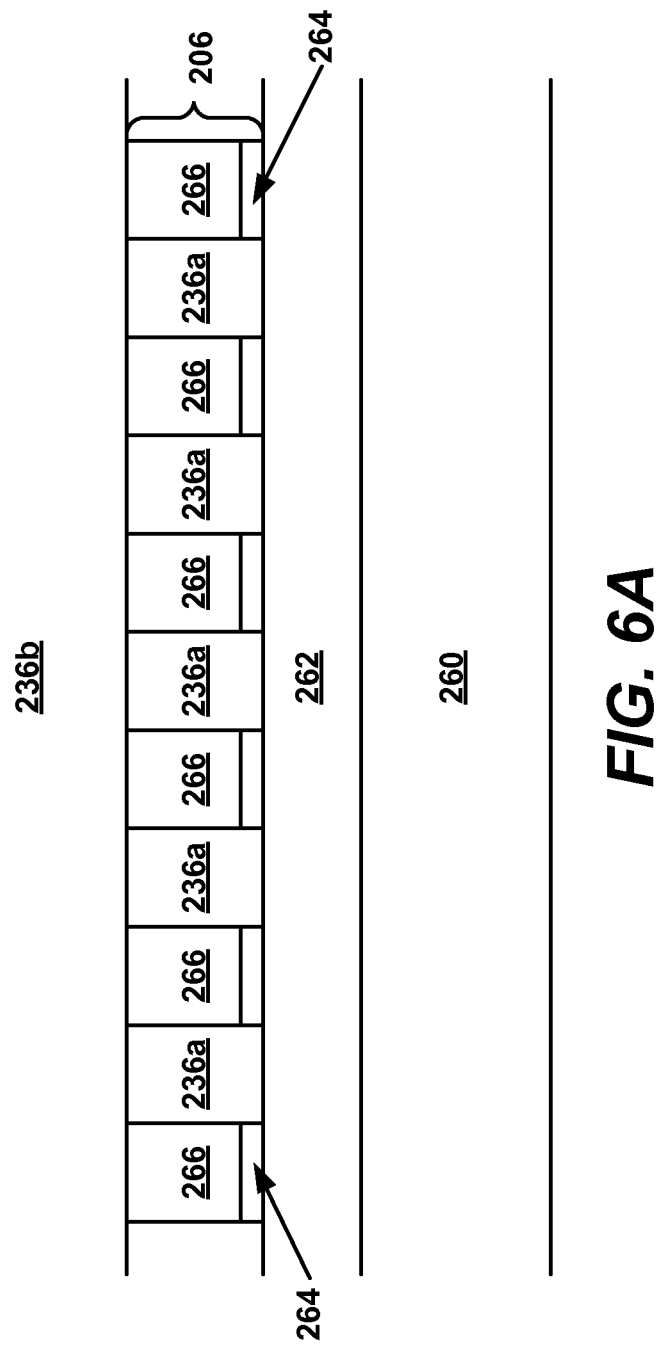
FIGS. 6A-6D illustrate cross sectional views of a portion of a substrate during an alternative example fabrication of a single memory level in accordance with the present invention.

With reference to FIG. 6A, substrate 260 is shown as having already undergone several processing steps, including formation of first conductors 206, and formation of dielectric material 236b on dielectric material 236a and first conductors 206. For example, dielectric material 236b may be between about 100 angstroms and about 5000 angstroms, more generally between about 10 angstroms and about 2 microns of silicon dioxide, silicon nitride, silicon oxynitride, or other similar insulating material. Dielectric material 236b may be formed by CVD, high density plasma, or other similar method. Other thickness values may be used.

Figure 6B:
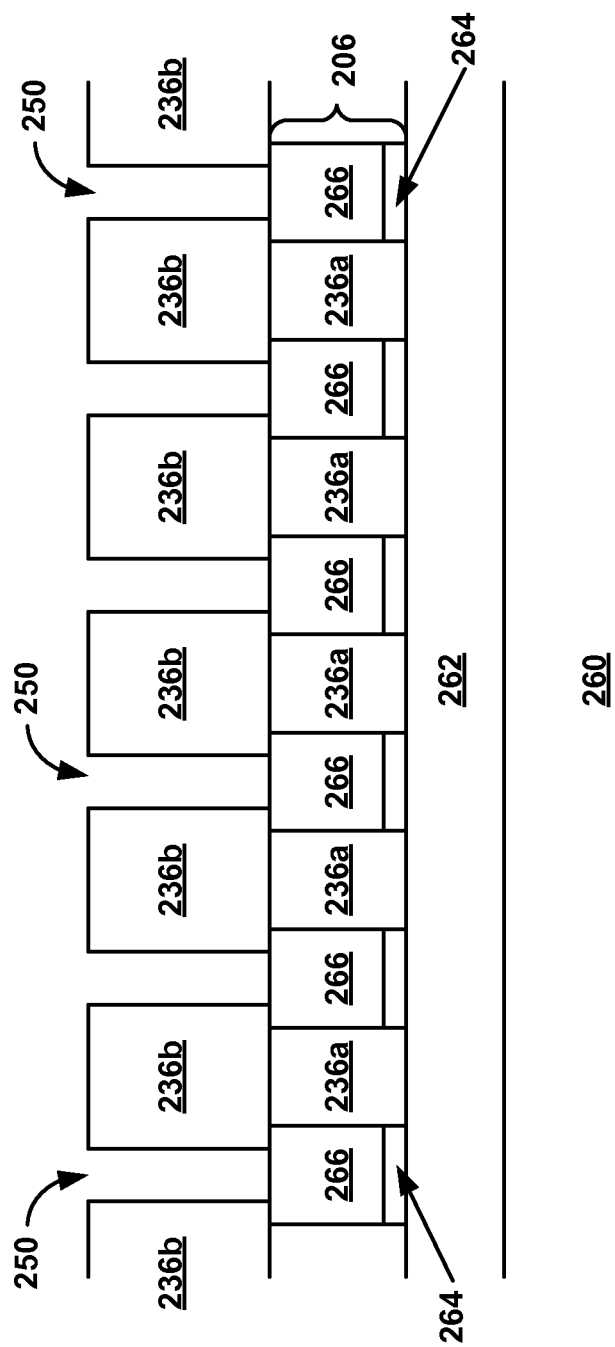

Dielectric material 236 may then be patterned and etched to create openings or voids 250 that extend to first conductor 206, such as described above in connection with FIGS. 3C-3D. The resulting structure is shown in FIG. 6B. As described above, various patterning techniques may be used to form openings or voids 250 in dielectric material 236. For example, imprint lithography, immersion lithography, EUV lithography, or other similar lithography techniques may be used to form openings or voids 250 having features (e.g., widths and lengths) less than about 10 nanometers.

Figure 6C:
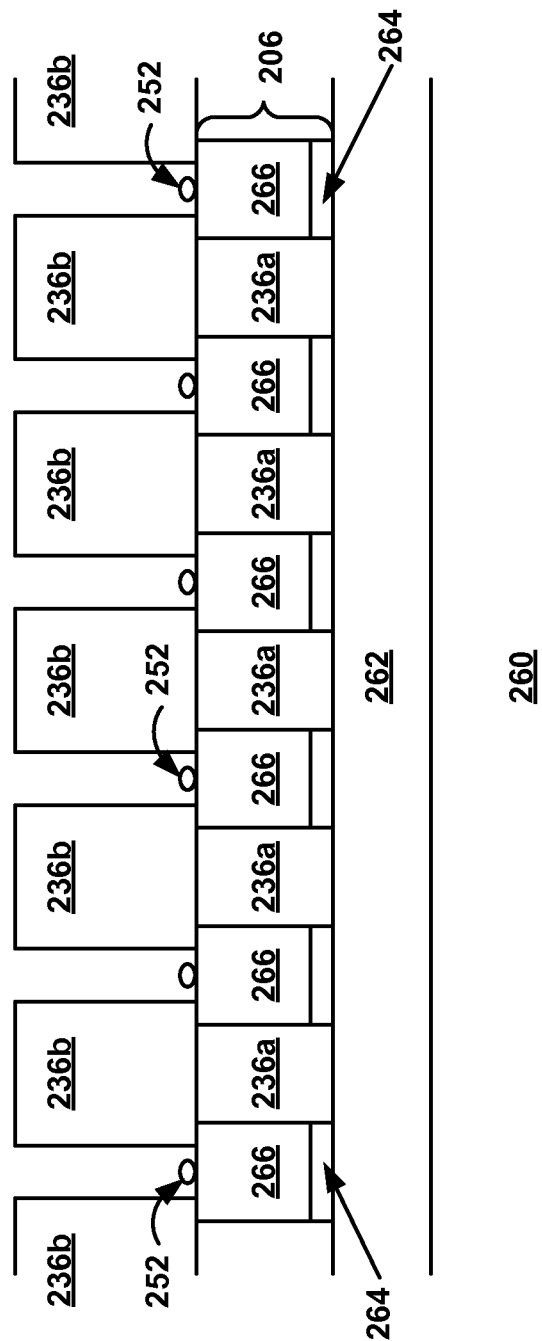

Following formation of openings or voids 250, a CNT seed particle 252 is formed in each opening or void. The resulting structure is shown in FIG. 6C. In one example embodiment, CNT seed particle 252 is selectively deposited in each opening or void 250, and a single CNT including CNT switch 202 and CNT diode 204 is grown on CNT seed particle 252. Although CNT seed particle 252 is depicted in FIG. 6C as spherical in shape, persons of ordinary skill in the art will understand that seed particles in accordance with this invention may have other shapes.

Example CNT seed particles 252 may include cobalt, titanium, iron, molybdenum, nickel, or other similar metals, organo-metallic precursors derived from cobalt, titanium, iron, molybdenum, nickel, or other similar metals (e.g., ferrocene from iron, etc.), ferritin particles with between about 5-400 atoms of Fe, iron acetate $((C_2H_3O_2)_2Fe)$ dissolved in ethanol/ethylene glycol or other organic solution, or other similar CNT seed particle or catalyst materials.

CNT seed particles 252 may be selectively deposited in openings or voids 250 by any suitable method, such as those described above in connection with FIG. 3D. Following selective deposition of CNT seed particles 252 in openings or voids 250, a CNT fabrication process is performed to selectively grow and/or deposit CNT diode 204 and CNT switch 202 on CNT seed particle 252. By virtue of the narrow width of openings or voids 250, CNT diode 204 and CNT switch 202 preferably include a single CNT.

Any suitable method may be used to form CNT diode 204 and CNT switch 202 on CNT seed particle 252, such as the techniques described above in connection with FIG. 3D. To form CNT diode 204, N and P sections (such as heavily doped n+CNT region 204a and heavily doped p+CNT region 204c, respectively) are formed, such as using the techniques described above in connection with FIG. 3E.

Figure 6D:
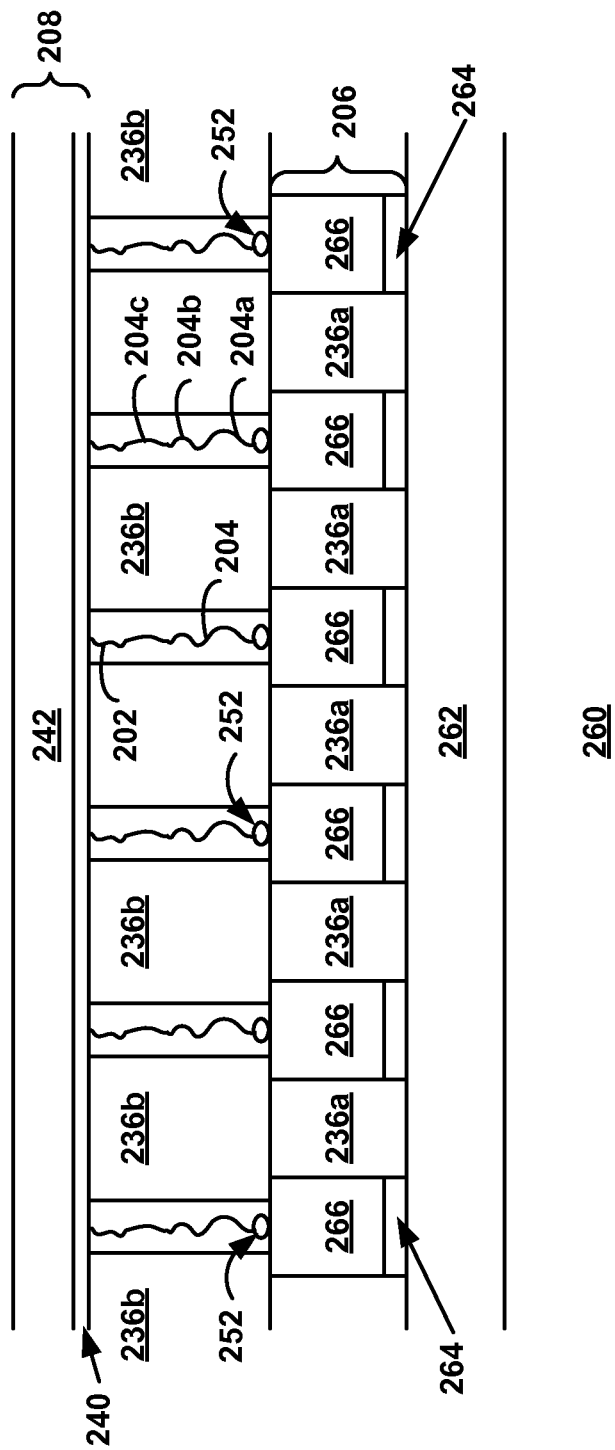

CNT switch 202 may be formed above CNT diode 204, or vice-versa. For example, as shown in FIG. 6D, CNT diode 204 may be formed on CNT seed particle 252, and CNT switch 202 may be formed above CNT diode 204. Persons of ordinary skill in the art will understand that CNT switch 202 may be formed on CNT seed particle 252, and CNT diode 204 may be formed above CNT switch 202.

CNT diode 204 may be a p-n or p-i-n diode, whether upward pointing or downward pointing. As shown in FIG. 6D, CNT diode 204 may be a downward pointing diode that includes a heavily doped n+CNT region 204a, a lightly doped or intrinsic (unintentionally doped) CNT region 204b above n+CNT region 204a, and a heavily doped p+CNT region 204c above intrinsic CNT region 204b.

Following formation of CNT switch 202 and CNT diode 204, dielectric material 236b is deposited on top of and around CNT switch 202 and CNT diode 204 to substantially fill the remaining area around CNT switch 202 and CNT diode 204 in openings or voids 250. A CMP or dielectric etchback step then is performed to planarize dielectric material 236 and remove the dielectric material from the top of CNT diode 204. As described above in connection with FIG. 3C, following planarization of dielectric material 236, second conductor 208 is formed. The resulting structure is shown in FIG. 6D. As also described above in connection with FIG. 3C, ECD or cleaning procedures may be used following CMP to improve the connection between CNT diode 204 and second conductor 208.

As described above in connection with FIG. 3E, as an alternative to selective formation of CNT seed particles 252 in openings or voids 250, CNT seed particles 252 may be non-selectively deposited.

Alternative Example Memory Cell

Figure 7:
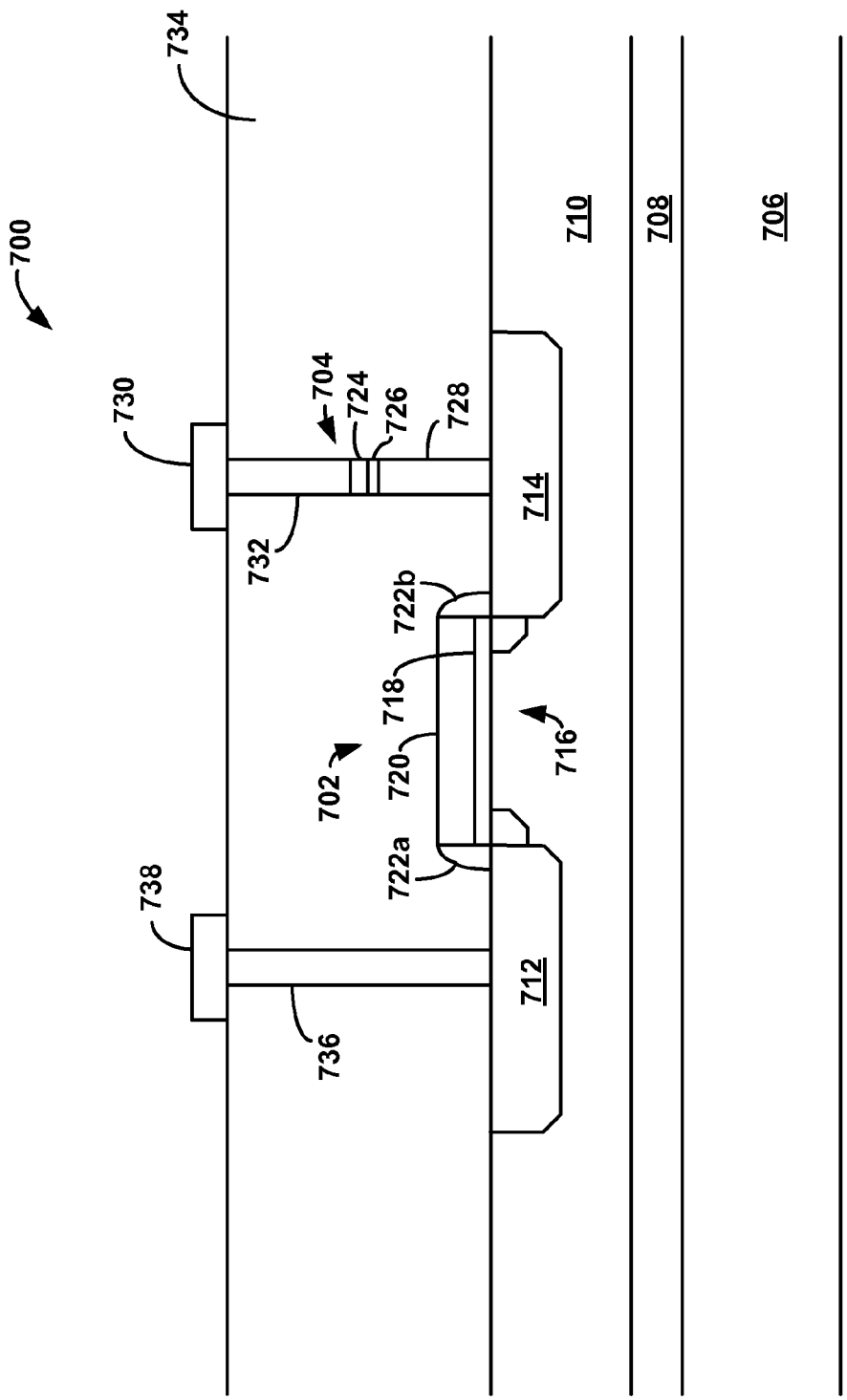
FIG. 7 is a cross sectional view of a first alternative memory cell provided in accordance with the present invention.

FIG. 7 is a cross sectional view of an example memory cell 700 provided in accordance with the present invention.

Memory cell 700 includes a thin film transistor ("TFT"), such as a thin film, metal oxide semiconductor field effect transistor ("MOSFET") 702 coupled to a reversible resistance-switching element 704 formed above a substrate 706.

For example, MOSFET 702 may be an n-channel or a p-channel thin film MOSFET formed on any suitable substrate. In the embodiment shown, an insulating region 708 such as silicon dioxide, silicon nitride, oxynitride, etc., is formed above substrate 706 and a deposited semiconductor region 710 such as deposited silicon, germanium, silicon-germanium, etc., is formed above insulating region 708. Thin film MOSFET 702 is formed within deposited semiconductor region 710 and is insulated from substrate 706 by insulating region 708.

MOSFET 702 includes source/drain regions 712, 714 and channel region 716, as well as gate dielectric layer 718, gate electrode 720 and spacers 722*a-b*. In at least one embodiment, source/drain regions 712, 714 may be doped p-type and channel region 716 may be doped n-type, while in other embodiments source/drain regions 712, 714 may be doped n-type and channel region 716 may be doped p-type.

Any other MOSFET configuration or any suitable fabrication techniques may be employed for thin film MOSFET 702. In some embodiments, MOSFET 702 may be electrically isolated by isolation regions (not shown) formed using an STI, LOCOS or other similar process. Alternatively, gate, source and/or drain regions of MOSFET 702 may be shared with other transistors (not shown) formed on substrate 706.

Reversible resistance-switching element 704 includes a reversible resistivity-switching CNT material 724 formed over a conductive plug 728. In at least one embodiment, reversible resistivity-switching CNT material 724 is formed using a selective formation process as previously described with reference to the embodiments of FIGS. 1-6D. For example, a CNT seeding layer 726 such as titanium nitride or tantalum nitride and/or a metal catalyst such as nickel, cobalt, iron, titanium, molybdenum, etc., may be formed over conductive plug 728. CNT material 724 then may be selectively formed over CNT seeding layer 726 as previously described.

As shown in FIG. 7, reversible resistance-switching element 704 is coupled to source/drain region 714 of MOSFET 702 by first conductive plug 728 and to a first metal level (M1) line 730 by a second conductive plug 732 (which extend through a dielectric layer 734). Likewise, a third conductive plug 736 couples source/drain region 712 of MOSFET 702 to an M1 line 738. The conductive plugs and/or lines may be formed from any suitable materials (without or without barriers layers) such as tungsten, another metal, heavily doped semiconductor material, a conductive silicide, a conductive silicide-germanide, a conductive germanide, or the like.

Note that when MOSFET 702 is an n-channel device, region 712 serves as the drain and region 714 serves as the source for MOSFET 702; and when MOSFET 702 is an p-channel device, region 712 serves as the source and region 714 serves as the drain for MOSFET 702. Dielectric layer 734 may include any suitable dielectric such as silicon dioxide, silicon nitride, silicon oxynitride, low K dielectrics, etc.

In memory cell 700, thin film MOSFET 702 operates as a steering element in a manner similar to that of the diodes employed in the memory cells of FIGS. 2A-4D, selectively limiting the voltage applied across and/or the current flow through reversible resistance-switching element 704.

The foregoing description discloses only example embodiments of the invention. Modifications of the above disclosed apparatus and methods which fall within the scope of the invention will be readily apparent to those of ordinary skill in the art.

Accordingly, while the present invention has been disclosed in connection with example embodiments thereof, it should be understood that other embodiments may fall within the spirit and scope of the invention, as defined by the following claims.

The invention claimed is:

1. A method of fabricating a memory cell comprising:
   fabricating a steering element in the form of a pillar structure above a substrate; and
   fabricating a reversible-resistance switching element coupled to the steering element by selectively fabricating carbon nano-tube ("CNT") material above the substrate, wherein:
   the CNT material comprises a single CNT that includes both the steering element and the reversible resistance-switching element, and the pillar structure has a width of less than about 10 nanometers.

2. The method of claim 1, wherein fabricating the reversible-resistance switching element includes:
   fabricating a CNT seeding layer;
   patterning and etching the CNT seeding layer; and
   selectively fabricating a single CNT on the CNT seeding layer.

3. The method of claim 2, wherein fabricating the CNT seeding layer includes:
   depositing titanium nitride; and
   roughening a surface of the deposited titanium nitride.

4. The method of claim 3, further comprising selectively depositing a metal layer on the roughened titanium nitride surface.

5. The method of claim 4, wherein the metal layer comprises nickel, cobalt or iron.

6. The method of claim 2, wherein fabricating the CNT seeding layer includes:
   depositing titanium nitride above the first conductor; and
   selectively depositing a metal catalyst layer on the titanium nitride.

7. The method of claim 6, wherein the metal layer comprises nickel, cobalt or iron.

8. The method of claim 2, wherein the CNT seeding layer comprises nickel, cobalt or iron.

9. The method of claim 1 wherein fabricating the reversible-resistance switching element includes:
   fabricating a CNT seed particle; and
   selectively fabricating a single CNT on the CNT seeding particle.

10. The method of claim 9, wherein the CNT seed particle comprises one or more of cobalt, titanium, iron, molybdenum, nickel, and an organo-metallic precursor derived from cobalt, titanium, iron, molybdenum or nickel.

11. The method of claim 1, wherein fabricating the steering element comprises fabricating a p-n or p-i-n diode.

12. The method of claim 11, wherein fabricating the steering element comprises fabricating a CNT diode.

13. The method of claim 1, further comprising fabricating the reversible-resistance switching element above the steering element.

14. The method of claim 1, further comprising fabricating the steering element above the reversible-resistance switching element.

15. A memory cell formed using the method of claim 1.

16. A memory cell comprising:
   a steering element in the form of a pillar structure having a width of less than about 10 nanometers; and
   a reversible resistance-switching element coupled to the steering element, wherein the reversible resistance-switching element comprises a selectively fabricated carbon nano-tube ("CNT") material, wherein the CNT material comprises a single CNT that includes both the steering element and the reversible resistance-switching element.

17. The memory cell of claim 16, wherein the steering element comprises a p-n or p-i-n diode.

18. The memory cell of claim 17, wherein the diode comprises a CNT diode.

19. The memory cell of claim 16, further comprising a patterned and etched CNT seeding layer on which the CNT material is selectively fabricated.

20. The memory cell of claim 19, wherein the CNT seeding layer comprises one or more of titanium nitride, tantalum nitride, nickel, cobalt and iron.

21. The memory cell of claim 16, wherein the reversible-resistance switching element is above the steering element.

22. The memory cell of claim 16, wherein the steering element is above the reversible-resistance switching element.

23. A monolithic three dimensional memory array comprising:
   a first memory level formed above a substrate, the first memory level comprising:
      a plurality of memory cells, wherein each memory cell of the first memory level comprises:
         a steering element in the form of a pillar structure having a width of less than about 10 nanometers; and
         a reversible resistance-switching element coupled to the steering element, wherein the reversible resistance-switching element comprises a selectively fabricated carbon nano-tube ("CNT") material, wherein the CNT material comprises a single CNT that includes both the steering element and the reversible resistance-switching element; and
      at least a second memory level monolithically formed above the first memory level.

24. The monolithic three dimensional memory array of claim 23, wherein the steering element comprises a p-n or p-i-n diode.

25. The monolithic three dimensional memory array of claim 24, wherein the diode comprises a CNT diode.

26. The monolithic three dimensional memory array of claim 23, further comprising a patterned and etched CNT seeding layer on which the CNT material is selectively fabricated.

27. The monolithic three dimensional memory array of claim 26, wherein the CNT seeding layer comprises one or more of titanium nitride, tantalum nitride, nickel, cobalt and iron.

28. The monolithic three dimensional memory array of claim 23, wherein in each memory cell of the first memory level, the reversible-resistance switching element is above the steering element.

29. The monolithic three dimensional memory array of claim 23, wherein in each memory cell of the first memory level, the steering element is above the reversible-resistance switching element.

* * * * *